United States Patent [19]

McWilliams et al.

[11] Patent Number: 5,214,844

[45] Date of Patent: Jun. 1, 1993

[54] METHOD OF ASSEMBLING INTEGRATED CIRCUITS TO A SILICON BOARD

[75] Inventors: Bruce M. McWilliams, Pleasanton; Nicholas E. Brathwaite, Hayward; David B. Tuckerman, Dublin, all of Calif.

[73] Assignee: nCHIP, Inc., San Jose, Calif.

[21] Appl. No.: 629,731

[22] Filed: Dec. 17, 1990

[51] Int. Cl.⁵ .............................. H05K 3/34
[52] U.S. Cl. .................... 29/840; 29/832; 264/272.13
[58] Field of Search .............. 29/840; 269/272.13; 361/383; 437/205

[56] References Cited

U.S. PATENT DOCUMENTS

| | | | |
|---|---|---|---|
| 4,293,587 | 10/1981 | Trueblood | 427/90 |
| 4,467,400 | 8/1984 | Stopper | 361/403 |
| 4,471,839 | 9/1984 | Chamberlain | 371/21 |
| 4,484,215 | 11/1984 | Pappas | 357/80 |
| 4,486,705 | 12/1984 | Stopper | 324/73 |
| 4,489,397 | 12/1984 | Lee | 364/900 |
| 4,493,055 | 1/1985 | Osman | 365/78 |
| 4,643,804 | 2/1987 | Lynch et al. | 204/15 |
| 4,675,717 | 6/1987 | Herrero et al. | 357/71 |
| 4,703,288 | 10/1987 | Frye et al. | |
| 4,732,865 | 3/1988 | Evans et al. | 437/12 |
| 4,789,645 | 12/1988 | Calviello et al. | |
| 4,802,532 | 2/1989 | Dawes et al. | 361/383 X |
| 4,826,896 | 5/1989 | Proctor | 264/272.13 X |
| 4,914,815 | 4/1990 | Takada et al. | 29/840 |
| 4,923,825 | 5/1990 | Blouke et al. | 437/53 |
| 4,937,653 | 6/1990 | Blonder et al. | 357/68 |
| 4,955,132 | 9/1990 | Ozawa | 29/840 |

FOREIGN PATENT DOCUMENTS

| | | |
|---|---|---|
| 3621917 | 1/1988 | Fed. Rep. of Germany . |
| 281076A1 | 7/1990 | Fed. Rep. of Germany . |
| 55-86144 | 6/1980 | Japan . |
| 58-210977 | 12/1983 | Japan . |
| 2-1504415 | 6/1990 | Japan . |
| 2-214718 | 8/1990 | Japan . |

OTHER PUBLICATIONS

Abstract of Japan Pat. 88-40698 by NEC Corp. entitled Seal Resin Contain Metal Powder; Useful Coating Hybrid IC.

Abstract of IEEE Trans. Compon., Hybrids, Manf. Technol., 1985, CHMT-8(4) 490-9 by M. Mahalingam et al.

Abstract of Pr. Nauk. Inst. Technol. Electron. Politech. Wroclaw. 1986, 34, 89-92 by W. Janke et al.

J. Electronic Materials, vol. No. 4, 1988, pp. 285-289, PT Wire Wedge Bonding: A New IC and Microsensor Interconnect by J. V. Mantese et al.

"Multichip Modules: Next Generation Packages", Robert R. Johnson, IEEE Spectrum, Mar. 1990.

"Forming Decoupling Capacitors On A Substrate", p. 1188, Sep. 1976, *IBM Techincal Disclosure Bulletin.*

"Multi-Chip Packaging Technology for VSLI-Based Systems", pp. 224 & 225, Feb. 30, 1987, *IEEE 1987 Solid-State Circuits Conference.*

Tuckerman, et al., "Ultrahigh Thermal Conductance Micro-Structures for Cooling Integrated Circuits" pp. 145-149, May 1982.

(List continued on next page.)

*Primary Examiner*—Carl J. Arbes
*Attorney, Agent, or Firm*—Townsend & Townsend

[57] ABSTRACT

An assembly structure and process for attaching integrated circuits to multichip modules and attaching the module to a printed circuit board. An epoxy loaded with diamond dust or boron nitride is used to attach the integrated circuit to the module. The dust material increases the thermal conductance of the epoxy for improved heat dissipation without substantially increasing the capacitance of interconnect routed underneath the epoxy. Reverse wedge wire bonding is also used to electrically connect the integrated circuit to the module allowing greater chip densities on the module surface. The chip/module assembly can then be mounted on a printed circuit board and the module leads wired directly to the board.

16 Claims, 18 Drawing Sheets

OTHER PUBLICATIONS

Tuckerman, "Heat-Transfer Microstructures for Integrated Circuits", Ph.D. Thesis, Stanford University, 1984.

Tuckerman, "High Performance Liquid Cooling of Integrated Circuits Using Silicon Microstructures", *Bulletin of the American Physical Society*, Ser. 2, V. 29, No. 3, pp. 463, 1984.

McWilliams et al., "Wafer-Scale Integration" *Energy and Technology Review*, pp. 1-9, 1985.

Mundinger, D. et al, "Demonstration of High-Performance Silicon Microchannel Heat Exchangers for Laser Diode Array Cooling" Sep. 19, 1988.

Wolfe, "Electronic Packaging Issues in the 1990s", *Electronic Packaging & Production*, Oct. 1990.

Bernhardt, et al., "Multichip Packaging for Very High Speed Digital Systems", *Applied Surface Science*, V. 46, 1990.

Low-Cost Multichip Modules Push Limits of Packaging, Malinak, Electronic Design Intl., Jul. 1990 by D. Maliniak.

Start-Up Developing Multichip RISC Modules, MicroDesign Resource Inc., 1990, Microprocessor Report, May 30, 1990, vol. 4, No. 10, May 30, 1990.

Fabrication of High Density Multichip Interconnect Substrates, Licari, et al, IEEE, 1989 Natl. Aerospace & Electronics Conf WAECON vol 4, pp. 1682-1688.

Interconnection and Packaging of Solid State Circuits, Pedder, IEEE, J. Solid State Circuits vol. 24, No. 3, Jun. 1989, pp. 698-703.

A 1-Mbit Full Wafer MOS RAM, Egawa, et al, IEEE, Trans. on Electron Devices Aug. 1980 vol. FD-27, No. 8, pp. 1612-1621.

Wafer-Chip Assembly for Large Scale Integration, Kraynak, IEEE, Trans. on Electron Devices vol. ED-15, No. 9, Sep. 1968, pp. 660-663.

Wafer-Scale Integration: the Limits of VLSI?, Peltzer, VLSI Design, Sep. 1983, pp. 43-47.

MMIC vs Hybrid: Glass Microwave ICs Rewrite the Rules, Perko, et al, Microwave Journal, Nov. 1988, pp. 67-76.

Multichip Assembly with Flipped Integrated Circuits, Heinen, et al, IEEE, Trans Components, Hybrids and Mfg. Tech. vol. 12, No. 4, Dec. 1989, pp. 650-657.

Chip Alignment Templates for Multichip Module Assembly, Tewksbury et al, IEEE Trans. on Components, Hybrids & Mfg. Tech. vol. CHMT-10, No. 1, Mar. 1987, pp. 111-121.

Ultra-Reliable Packaging for Silicon-on-Silicon WSI, Hagge, IEEE, Trans. on Components, Hybrids & Mfg. Tech. vol. 12, No. 2, Jun. 1989, pp. 170-177.

Thermal Module Design for Advanced Packaging, Hwang, et al, J. Electronic Materials vol. 16, No. 5, 1987, pp. 347-355.

A Technology for Optical Interconnections Based on Multichip Integration, Tsang et al, Optical Engineering, Oct. 1986, vol. 125, No. 10.

Low Stress Design of Flip Chip Technology for Si on Si Multichip Modules, Yamada, et al, IEPS, Oct. 1985, pp. 551-556.

New Packaging Strategy to Reduce System Costs, Balde, IEEE Intr. Conf on Computer Design: VLSI in Computers Oct. 1984, pp. 579-581.

A High Speed Multichip RAM Module with Thermal Stress Free Configuration, Satoh, et al, ICCD 1984, pp. 569-572.

Recent Developments in Silicon Hybrid Multichip Modiules, Corless, IEEE, Intr. Electronic Mfg. Technology Symposium Sep. 1989, pp. 111-117.

The Design of a Multichip Single Package Digital Signal Processing Module, Lin-Hendel, et al, IEEE 1989 Intr. Conf. on Computer Design: VLSI in Computers and Processors pp. 224-228.

Silicon Interconnect Technology, Johnson et al, Electronic Convention Mngmnt., Electro 87 Mini/Micro Northeast Conf. Record 1987, p. 36/1.

Discrete Wafer Scale Integration, Johnson, et al, IFIP, 1986.

Silicon on Silicon Packaging, Spielberger, et al, IEEE Trans. Components, Hybrids & Mfg. Technology, vol. CHMT-7, No. 2, Jun. 1984, pp. 193-196.

Silicon Packaging, A New Packaging Technique, Huang, et al, IEEE, Custom IC Conf. Rochester, N.Y. May 1983 pp. 142-146.

Multichip Thin-Film Technology on Silicon, Johnson, et al, IEEE, Trans. Components, Hybrids and Mfg. Technology vol. 72, No. 2, Jun. 1989, pp. 185-194.

Multichip Packaging Technology with Laser-Patterned Interconnect Barfknecht et al, IEEE, Trans.

OTHER PUBLICATIONS

Components, Hybrids and Mfg. Tech. vol. 12, No. 4 Dec. 1989, pp. 646-649.

Multichip Modules AIM at Next-Generation VLSI, Lyman, Electronic Design, Mar. 1989, pp. 33-36.

Internal Thermal Resistance of a Multi-Chip Packaging Design for VLSI Based Systems, Lee, IEEE, Trans. Comp., Hybrids & Mfg. Tech. vol. 12, No. 2 Jun. 1989, pp. 163-169.

High Heat Flux Cooling for Silicon Hybrid Multichip Packaging, Jaeger, et al, IEEE, Trans. Components, Hybrids & Mfg. Tech. vol. 12, No. 4, Dec. 1989 p. 772.

New TCE-Matched Glass Ceramic Multichip Module: II Materials, Mechanical and Termal Aspects, Carrier, et al, IEEE 39 Electronics Computer Conferon May 1989.

Microelectronics Packaging II, Schwartz, Ceramic Bulletin, vol. 63, No. 4, 1984, pp. 577-581.

Applications of Thin Film Interconnection Technology for VLSI Multichip Packaging, Ting, et al, Proc. of 1987 Intr. Symposium on Microelectronics by Intr. Soc. Hybrid Microelectronics Sep. 1987.

METHOD OF ASSEMBLING INTEGRATED CIRCUITS TO A SILICON BOARD

BACKGROUND OF THE INVENTION

The present invention relates to the interconnection and packaging of integrated circuits (ICs). More particularly, the present invention relates to the packaging of ICs on multichip modules.

As silicon device geometries shrink, IC densities and speed performance improve considerably. For example, some currently available ICs contain hundreds of thousands of gates per chip, and as many as 300 input/output pins (I/O). Systems with these devices switch in subnanosecond times. Further advances in chip densities and performance beyond these values are expected.

Conventional packaging and printed circuit board interconnection systems used to link these semiconductor devices to form processor systems and other circuits contain large numbers of interconnections, long signal paths and high capacitance materials. These characteristics introduce ground bounce, switching noise and propagation delays to the system. The impact of ground bounce, noise and propagation delays on the system increases in proportion to the number of chip I/Os and operating speed. Thus, as chip capabilities improve, circuit design can no longer be considered in isolation from packaging and interconnection design, since the packaging and interconnection hardware exact a performance penalty on the resulting systems.

To counter the limitations of commercially available, conventional packaging, designers of high-end computers frequently develop proprietary interconnection packages. Development of these packages is expensive and delays the time to market of the improved processor. However, as shown in FIG. 1, despite the efforts expended to develop proprietary packaging, system designers will encounter increasing difficulty in matching system speeds to bare chip speeds as improvements in IC technology continue. This performance gap 5 is represented in FIG. 1.

An approach to improving package performance and hence system speed is the multichip module. A multichip module is a collection of IC chips attached to a high density interconnect substrate that resembles and functions as a large, application-specific integrated circuit. A typical multichip module of the prior art is shown in U.S. Pat. No. 4,675,717 to Herrero et al. The module consists of a doped silicon substrate having power and ground planes. The doped substrate and the ground plane form one plate of a decoupling capacitor. The power plane forms the other plate of the capacitor. Above are the metal interconnect layers power and ground planes 14. The IC is either flip chip bonded to the metal interconnect layers or is secured using a bonding material and electrically connected to the metal interconnect layers using conventional wire bonding techniques. Other prior art modules include a layer of polyimide which serves as a dielectric between the metal interconnect layers.

Multichip modules of the types described above improve system performance in several ways. First, the capacitance of chip-to-chip interconnections is reduced by a factor of four over conventional packaging, thereby reducing signal propagation delays and power consumption. The shorter wire bonds reduce interconnect inductance and the resulting module serves to shorten signal delays over conventionally packaged systems. FIG. 2 illustrates the performance advantages achieved over conventional packaging by use of multichip modules. As is evident from the graph, the performance gap 30 inherent with multichip modules is significantly smaller than that incurred with conventional packaging.

Despite these performance improvements, the typical multichip module has several disadvantages that limit system performance, reduce yield and restrict the availability of multichip modules to a relatively small field of select users. Certain of these disadvantages stem from the use of polyimide and other organic materials as a dielectric. The raw material necessary to form the polyimide dielectric costs more than silicon-based materials and requires more processing steps to form the completed product. These characteristics of polyimide-dielectrics increase the cost of multichip modules and decrease the yield.

In addition, the mechanical properties of polyimide impose design constraints on the multichip system. Polyimides have poor thermal conductivity and a thermal expansion coefficient that differs from silicon based ICs. Polyimide structures therefore often require additional thermal metal pillars under the die to ensure adequate heat conduction and balanced thermal stresses. The area consumed by the pillars is unavailable as interconnect. Also, the polyimide dielectric is under tension after processing, and that tension, when coupled with metal film tension, results in a highly bowed, internally stressed structure. The bowed structure can cause module reliability problems. Finally, the polyimide has a tendency to absorb moisture. This characteristic can reduce part life and requires that special measures be taken to prevent corrosion.

Additional limitations on multichip module features arise from use of doped silicon as the module substrate. The doped silicon has a much higher current spreading resistance than a metal film. Furthermore, the requirement that the substrate be highly doped adds significantly to the module materials costs.

SUMMARY OF THE INVENTION

The present invention provides multichip module structures and processes for assembling integrated circuits on multichip modules. According to the embodiment of the present invention, a diamond or boron nitride loaded epoxy material is used to mechanically attach the integrated circuit to a multichip module, also called a silicon circuit board (SiCB). The epoxy material increases the thermal conductance of the epoxy for improved heat dissipation without substantially increasing the capacitances of any signal line running underneath the epoxy.

According to another embodiment of the invention, the epoxy material is loaded with high atomic weight particles to facilitate X-ray inspection of the adhesive for voids.

According to yet another embodiment of the present invention, reverse wedge wire bonding of the integrated circuits to the SiCB is used. The reverse wedge wire bonding improves the wire feed-to-adjacent chip clearances and allows integrated circuits to be spaced closer to each other on the chip.

According to another embodiment of the present invention, the module/integrated circuit assembly is mounted directly on the printed circuit board. The SiCB leads are wired directly to the circuit board.

BRIEF DESCRIPTION OF THE DRAWINGS

FIG. 11-1 and 11-2 is one continuous flow chart of a process for forming a multichip module according to an embodiment of the present invention;

DETAILED DESCRIPTION OF THE PREFERRED EMBODIMENT

Figure 3:
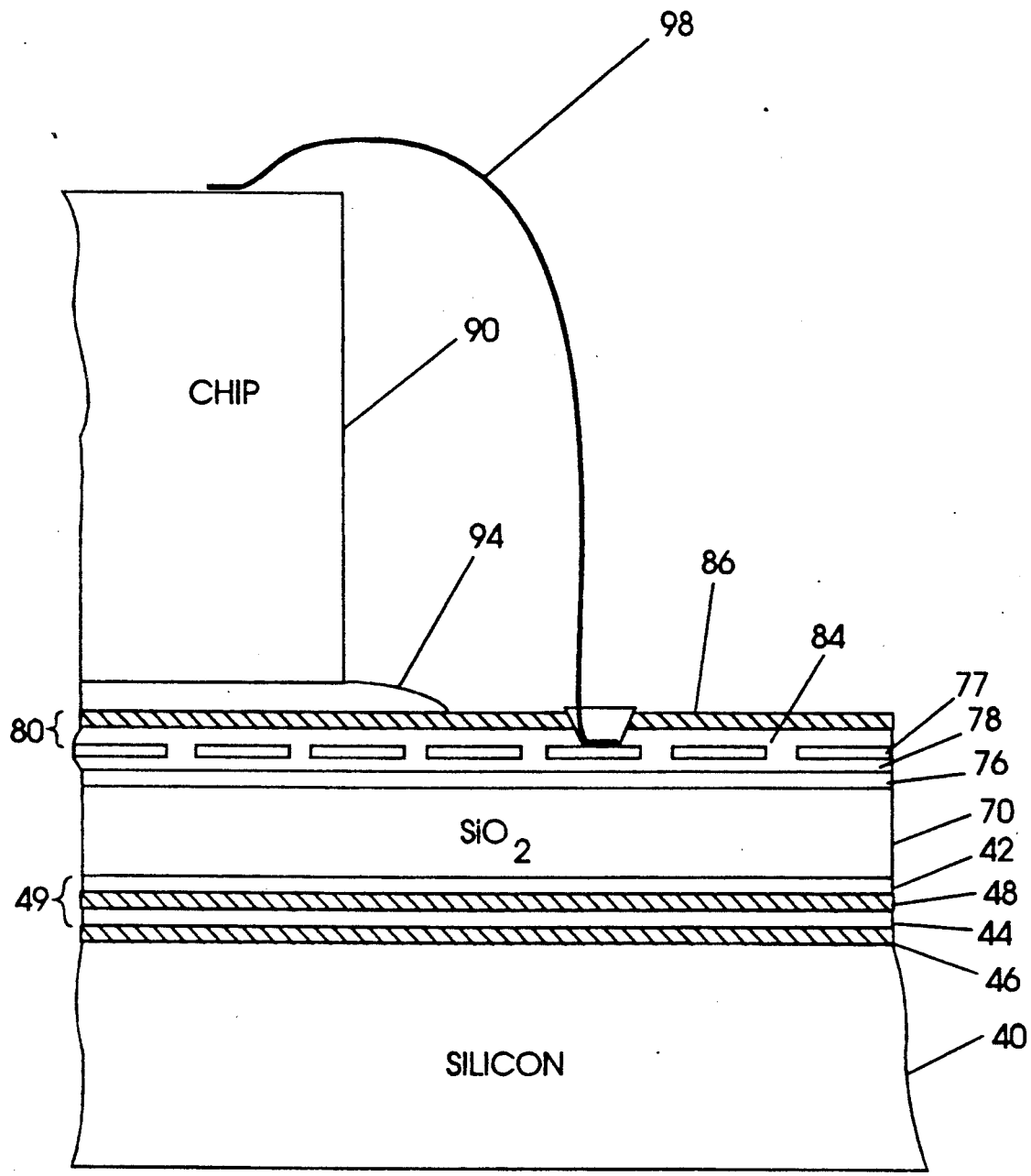
FIG. 3 is a cross-sectional view of a multichip module according to an embodiment of the present invention.

FIG. 3 shows a cross-sectional view of a multichip module fabricated according to an embodiment of the present invention. The module contains a support base 40 over which are located power and ground planes 42 and 44. Because contact to power and ground planes 42 and 44 can be made directly to the metal comprising these planes, the support base 40 need not be conductive. For this reason, there is no need to dope support base 40, and support base 40 can be formed of silicon or polycrystalline silicon or other materials. Support bases of any shape may also be used. The absence of electrical requirements on the material comprising support base 40 means support base 40 can be manufactured from raw silicon ingots, including the end portions that would normally be treated as scrap material. Raw material costs are thereby reduced and the additional processing step of doping the silicon, eliminated.

The use of silicon as the support base material also has various performance advantages. Silicon has high thermal conductivity and also provides a good thermal expansion match to the rest of the multichip package and the attached ICs. Other materials, however, also can be used to form support base 40. These materials include AlN, $Al_2O_3$ and copper-tungsten alloy. In addition, a composite sandwich structure of silicon and BeO may be used to match the thermal expansion properties of GaAs, as opposed to silicon-based chips.

On top of support base 40 is formed a conducting plane which in the embodiment of FIG. 3 comprises a power plane 42 and ground plane 44, which are separated from support base 40 by an oxide layer 46. Optional oxide layer 46 provides electrical isolation and also forms a metallurgical barrier that prevents interaction of the aluminum with the silicon. Power and ground planes 42 and 44 are composed of layers of aluminum. Other electrically conductive materials may also be used, provided the upper surface of conductive layer 44 is formed of anodizable material. For example, a copper conductive layer with tantalum adhesive layer may be used to comprise layer 44.

Separating power plane 42 from ground plane 44 is a dielectric layer 48 of $Al_2O_3$ formed by anodization of the aluminum layer 44. The anodization process provides a pinhole-free capacitor dielectric and improved electrical performance. A layer of silicon dioxide or silicon nitride may optimally be placed over the $Al_2O_3$ layer to further improve the pinhole-free properties of the $Al_2O_3$ layer.

Ground plane 44, power plane 42 and dielectric layer 48 form an integral decoupling capacitor 49. Capacitor 49 aids in reducing series inductance and ground bounce. Both power and ground planes and capacitor 49 are formed over the entire surface of the module and before any patterning of circuit interconnections takes place. This structural feature allows the capacitor size to increase as module size increases and eliminates the need for patterning during the formation of the capacitor. The elimination of the masking steps which make contact vias early in the process flow permits nearly completed modules to be placed in "inventory", thereby minimizing costs and shortening delivery time as will be explained below. It also substantially increases yields by greatly reducing the probability of particle contamination during fabrication of capacitor 49.

Figure 4:
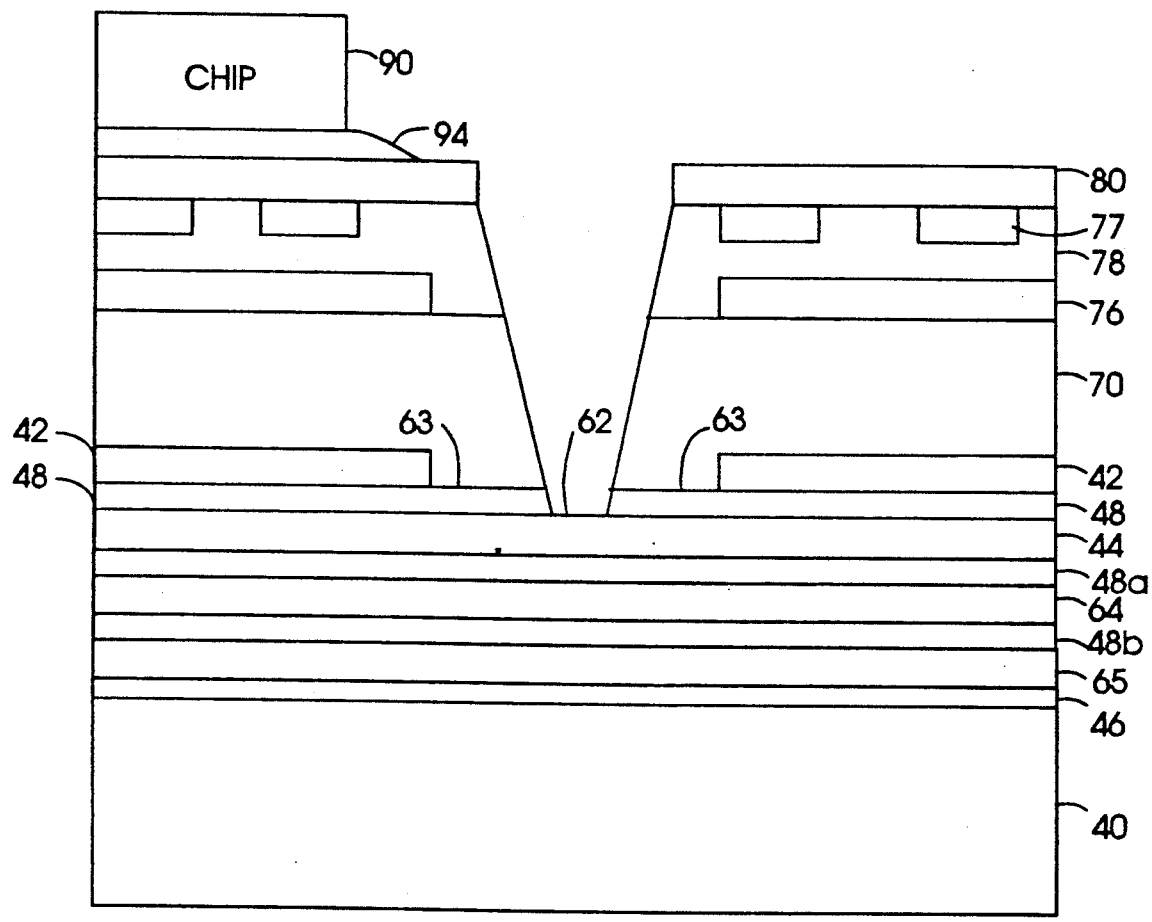
FIG. 4 is a partial cross-sectional view of vias used to contact the power and ground planes according to an embodiment of the present invention.

Contact to power plane 42 and ground plane 44 is made directly to the metal comprising the plane, using vias. FIG. 4 shows a cross-sectional view of a module in which a ground via 62 to ground plane 44 has been formed. A moat 63 electrically isolates power plane 42 from via 62. Direct contact to the power and ground planes relieves support base 40 from any requirement to be conductive and results in the advantages previously described. Direct contact to the metal also reduces spreading resistance further improving multichip performance.

Although only one power plane and one ground plane are depicted in FIG. 3, as many power and ground planes as desired with the structure described above can be formed one atop another. Furthermore, the module can be formed with fewer planes than that shown in FIG. 3 and the power and ground planes need not be arranged in the sequence shown. Multiple power and ground planes allow the module to provide multiple voltages to the ICs packaged on the module. The multichip module of the present invention is therefore suitable for use with a variety of semiconductor technologies; for example, CMOS, nMOS, GaAS, and bipolar technologies. Additional power and ground planes 64 and 65 are shown in FIG. 4. Contacts to these layers are elsewhere on the module and are not shown in the Fig.

Located on top of the power and ground planes is a dielectric layer 70 that insulates the power and ground planes 42 and 44 from metal signal carrying layers 76 and 77. In the present invention, dielectric layer 70 is formed of a silicon dioxide layer up to 20 μm thick. The thickness of the silicon dioxide layer provides low interconnect capacitance.

Prior to development of the present invention, silicon dioxide would not have been chosen as the material with which to form dielectric 70. Conventional processes deposit silicon dioxide under tension or extreme compression and thick layers of silicon dioxide deposited using these methods are thus prone to crack or induce delamination of the multilayer 20 structures in FIG. 4. A layer of silicon dioxide having the thickness desired ($\geq 5$ μm) to form a multichip module dielectric was therefore not feasible nor practical prior to the present invention. To obtain a silicon dielectric layer of the desired thickness without cracking, silicon dioxide is deposited under compression to provide benefits analogous to those achieved in tempered glass or prestressed concrete. Plasma-enhanced chemical vapor deposition of the silicon dioxide can be tightly controlled to match the other process stresses and virtually eliminate module camber. In contrast, essentially all polymer dielectrics are under tension after processing owing to their high expansion coefficient, and that tension couples with the metal film tension to yield a bowed, internally stressed substrate. One process for depositing the silicon dioxide under compression is described in U.S. patent application Ser. No. 07/629,499 to Schoenholtz for *Improved Plasma Enhanced Chemical Vapor Deposition Process* filed the same day as this application. Other processes and machines may be used. Although greater stress can be tolerated (typically up to $2 \times 10$ dynes/cm$^2$ compressive), generally, however, stress levels should be kept small; for example less than $1 \times 10^9$ dynes/cm$^2$ compressive.

The use of silicon dioxide to form dielectric layer 70 has several other advantages over the use of polyimide to form the dielectric layer. First, silicon dioxide does not absorb moisture as does the polyimide structure. Corrosion problems are thereby eliminated and the expense of encapsulating the module metal signal layers in barrier metals, avoided. Elimination of corrosion problems also permits non-hermetic packaging of the completed module/IC structure. Silicon dioxide also possesses better thermal characteristics than does polyimide. The improved thermal conductivity of silicon dioxide provides better heat dissipation thereby eliminating any requirement for thermal vias or pillars. The resulting module can withstand higher post-processing temperatures than modules incorporating the polyimide material.

Metal signal, or interconnection, layers 76 and 77 reside on top of silicon dioxide layer 70 and carry signals among the ICs mounted on the module. In the structure of FIG. 3, the general orientation of connections in layer 77 is perpendicular to those in layer 76. A second dielectric layer of silicon dioxide 78 separates metal signal layer 76 from metal signal layer 77. The metal interconnect layers can be formed of sputtered aluminum, sputtered copper or electroplated copper, gold and in some embodiments other conductive materials. Signal layers, in addition to those shown, can be formed to permit more than two signal connections.

Figure 5:
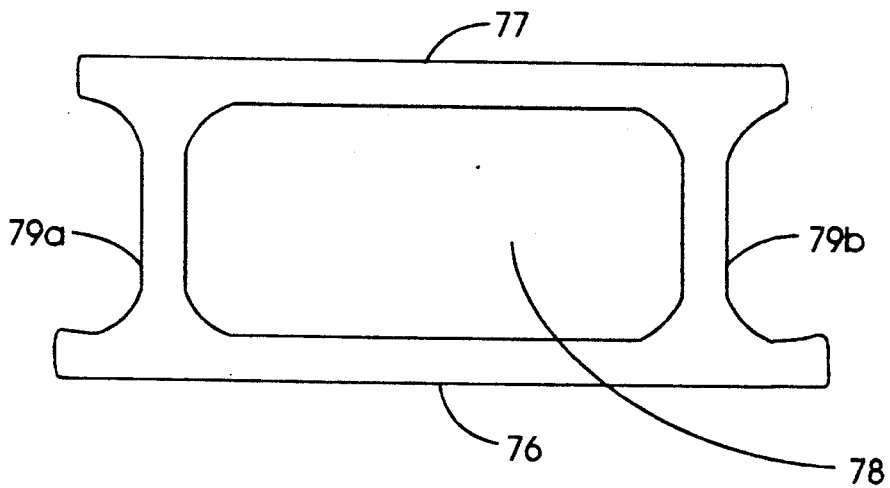
FIG. 5 is a cross-sectional view showing metal strapping of metal signal lines.

Metal signal layers 76 and 77 may also incorporate metal strapping techniques. The thin film metallization used to form metal signal layers 76 and 77 cover a significant distance on the module surface. The resistance of the layers due to length can therefore limit module performance. While the resistance of these layers can be reduced by increasing the thickness of the layers, the cost of fabricating each signal layer increases with the layer thickness. The metal strapping technique is especially useful for those signal paths where line resistance is of concern. FIG. 5 is a cross section of a metal signal layer formed using the metal strapping technique. Metal signal layers 76 and 77 are positioned one on top of the other. Layer 76 is shown slightly narrower than 77 as is standard practice to allow for manufacturing tolerances and avoid coincident edges. Layer 76 may also be formed slightly narrower than layer 77 to reduce fringe capacitance between the layers according to another embodiment of the invention. Layers 76 and 77 carry the same signal. The two layers are periodically tied together, for example, with vias 79a and 79b or with a trench (not shown). The metal strap technique reduces the resistance of signal lines without incurring a significant increase in capacitance.

Figure 6:
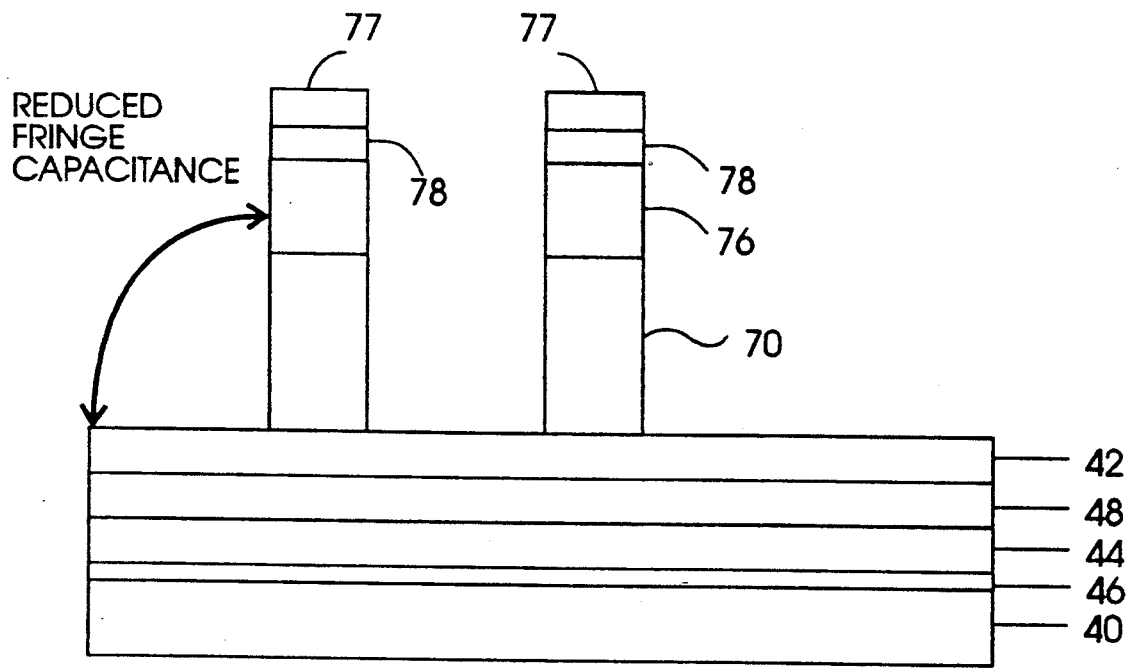
FIG. 6 is a view of metal interconnect structure according to an embodiment of the present invention.

According to another embodiment of the present invention, the electrical performance of the module may be further enhanced by removing areas of exposed dielectric 70 from everywhere except underneath the metal signal layers 76 and 77, to form the pedestal structure of FIG. 6. In FIG. 6, metal signal layers 76 and 77 reside on isolated pedestals of silicon dioxide 70 and 78. There is no requirement that 76 and 77 run parallel to each other although that is implied by FIG. 6. Reduced fringe and interconnect capacitance result, which further reduce signal propagation delays and system power consumption. The metal strapping technique of FIG. 5 also may be used in conjunction with the pedestal structure of FIG. 6.

Termination resistors (not shown) also may be formed at the ends of metal signal layers 76 by the addition of extra processing steps. The termination resistors are made with the same design rules (line widths and spacings) used to form the interconnect layers and therefore consume no additional module area. Since the geometry and electrical properties of the metal film(s) used to form layers 76 and 77 are known, the area of the termination resistor can be easily determined and the metal film patterned to provide the desired resistance.

On top of metal signal layers 76 and 77 is located a passivation layer 80. See FIG. 3. Passivation layer 80, preferably formed of a silicon dioxide layer 84 with a silicon nitride cap 86, serves to isolate the module layers from contaminants and protect the module from abrasions.

Typically, the IC 90 is mechanically mounted on the module by a layer of thermally conductive adhesive 94 located above passivation layer 80. The adhesive is also preferably electrically insulating without having an enormously high dielectric current. In an embodiment of the invention, a boron nitride or diamond loaded epoxy comprises the adhesive material. These materials increase the thermal conductivity of the epoxy for improved heat dissipation without substantially increasing the capacitance of signal lines running underneath the epoxy. Adhesive 94 may also be loaded with high atomic weight particles to facilitate x-ray inspection of the adhesive for voids in the adhesive die attachment. The high atomic weight particles should have an atomic number high enough to be conveniently exposed by X-ray, yet low enough so as not to be opaque. Germanium is an example of a suitable material. Electrically conductive adhesive (e.g., silver-filled) may also be used if back-side contact for the IC is required.

Optimally, back-side contact may be had using the nonelectrically conductive, yet thermally conductive epoxy materials described above by depositing a layer of this epoxy such that a hole remains in which the SiCB bond pad is exposed. A layer of electrically conductive epoxy may then be deposited over this layer to allow back-side contact. This dual layer attachment structure provides improved thermal conductance without substantially increasing the capacitance of metal signal layers running underneath the IC over the single layer silverfilled epoxy attachment structure. Additionally, the silverfilled epoxy layer can be omitted and a wire run from the back side of the IC through the hole in the nonelectrically conducting adhesive to the SiCB bond pad.

Electrical connection of IC 90 to the module can be accomplished using reverse wedge wire bonding to attach the IC leads 98 to bonding or die pads (not shown). Alternatively, IC 90 may be electrically connected to the multichip module using conventional wire bonding or flip chip technology. The pads connect to the underlying metal layers through vias. Because connection to the decoupling capacitor and termination resistors is provided elsewhere on the module through these vias, surface mounting of capacitors and resistors, and direct mechanical connection of these devices to the multichip module are not required. For this reason, IC 90 can be placed extremely close to the module bonding pad and to neighboring ICs.

Figure 7:
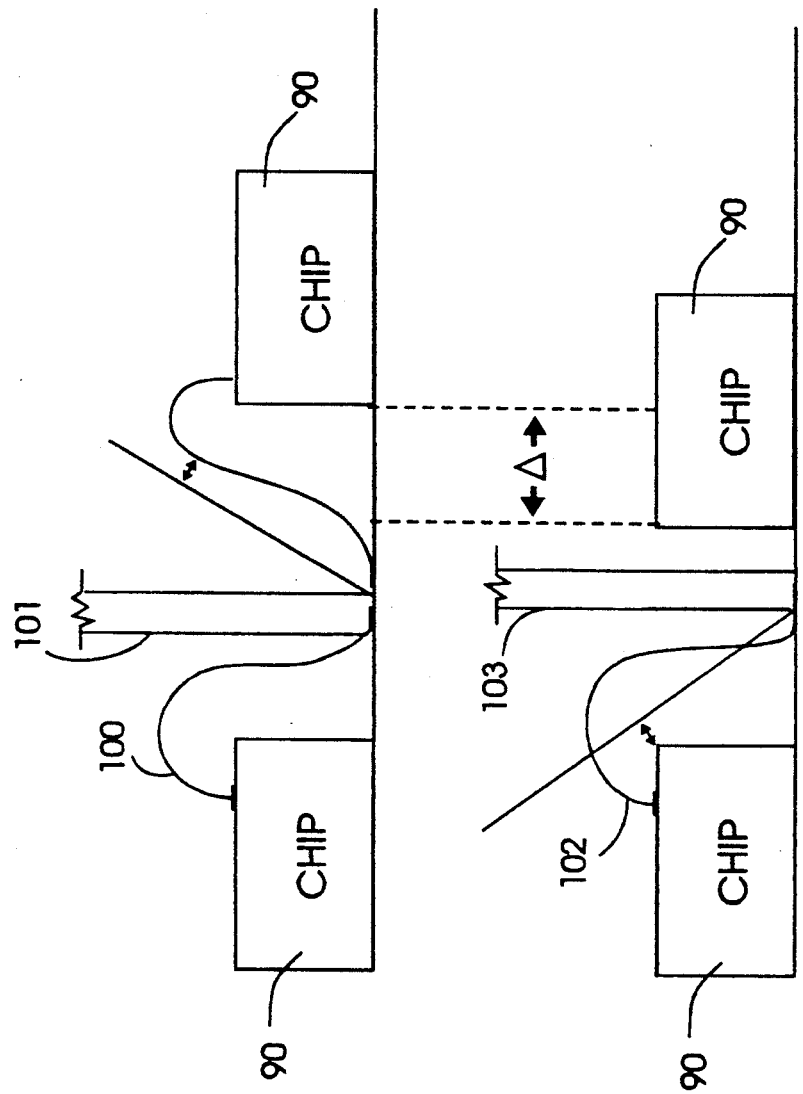
FIG. 7 is a comparison of conventional wire bonding with reverse wedge wire bonding.

FIG. 7 compares the space consumed by conventional wire bonding 100 with that used by reverse wedge wire bonding 102 used to connect IC 90 to the module bond pads according to an embodiment of the present invention. In reverse wire wedge bonding, the bond is made first to the module bond pads and then to the chip. As can be seen from the figure, reverse wedge wire bond techniques improve wiring densities over conventional wire bonding techniques a. The wire feed 104 of reverse wedge wiring tool 103 thus requires less clearance than the wire feed 105 of conventional tool 101. Because in conventional bonding, the wire is first bonded to the chip, wire feed 105 of tool 101 must clear both the chip and wire lead 100. In contrast, in reverse wedge wire bonding, tool 103 first bonds the lead to the substrate. Wire feed 106 need only clear chip 90 to bond the remaining end of the lead to the chip as lead 102 is being formed. The improved clearances also permit the interleaving of the wire bonds. This reverse wedge wire bond technique, in combination with the elimination of surface mounted decoupling capacitors and termination resistors, therefore, greatly improves chip densities, allowing approximately seventy-five percent of the module surface to be covered with ICs 90.

Figure 8:
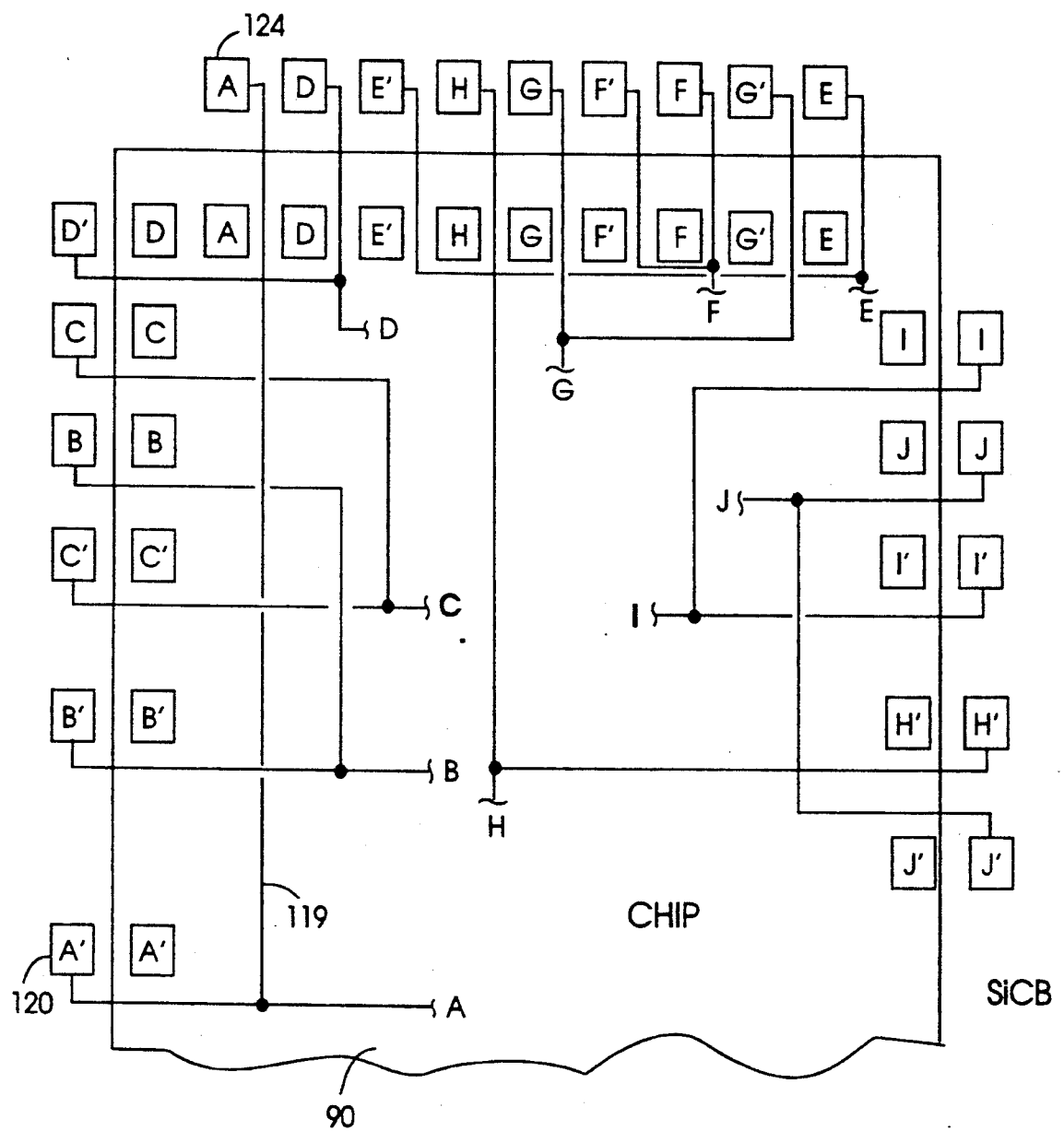
FIG. 8 shows a multiple padout construction on a multichip module according to an embodiment of the present invention.

The improved chip densities that stem from the structure of the termination resistors, decoupling capacitor and wire bonding/substrate-on-board mounting techniques permits the multichip module of the present invention to economically support more than one bond pad configuration and, therefore, more than one circuit or system. On typical boards, bond pads and leads are of such a dimension that a multiple padout scheme would impact board performance. A multiple padout structure for a multichip module according to the present invention is shown in FIG. 8 where pads 120 support one circuit configuration. Pads 124 support a second circuit configuration. The multiple padout structure means that a single multichip module of the present invention can economically support more than one chip geometry and that each multichip module need not be application-specific. For example, the multiple padout structure allows different manufacturer's memory chips to be used on the same SiCB. These features allow systems designers and integrators to establish second sources for individual component ICs.

Figure 9:
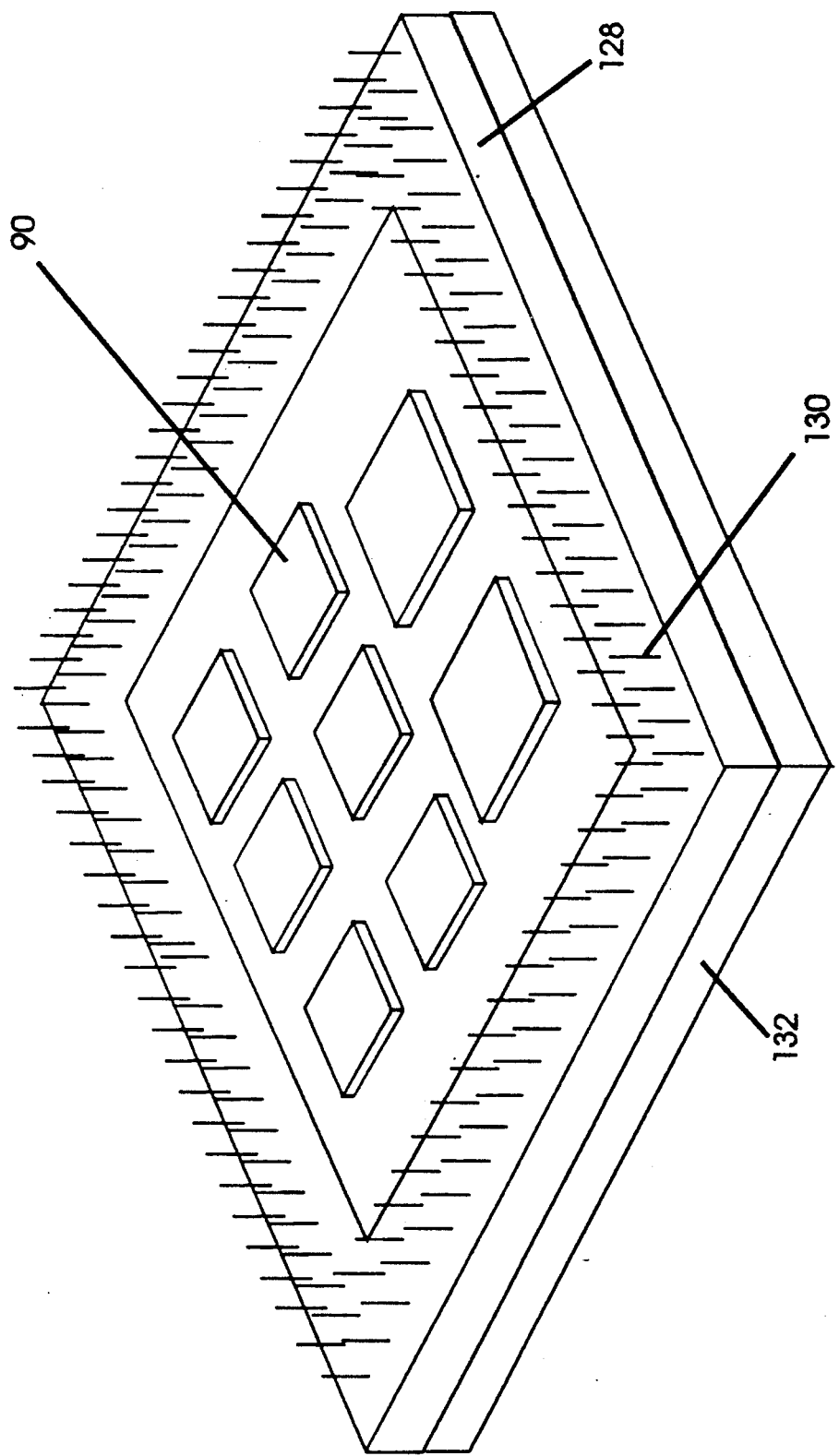
FIG. 9 is a top view of a module according to an embodiment of the present invention to which a number of integrated circuits have been attached.

FIG. 9 shows a module to which a number of ICs 90 have been attached. The module with attached ICs can be enclosed in a hermetically sealed package 128 and connected to the remainder of the system by package leads 130 to a printed circuit board. A heat sink 132 may be mounted on the back of package 128.

Alternatively, a substrate-on-board technique may be used to mount the module to the circuit board. In this packaging scheme, depicted in FIG. 10, the module identified by reference numeral 134, is mounted face down and the module leads 136 are wire bonded directly to the printed circuit board 140. Other methods of electrical attachment besides wire bonding may be used. For example, tape may be used. Wire bonds 138 connect the IC 90 to the module. A heat sink 137 cools the system. The substrate on board permits elimination of the hermetic package.

Figure 1:
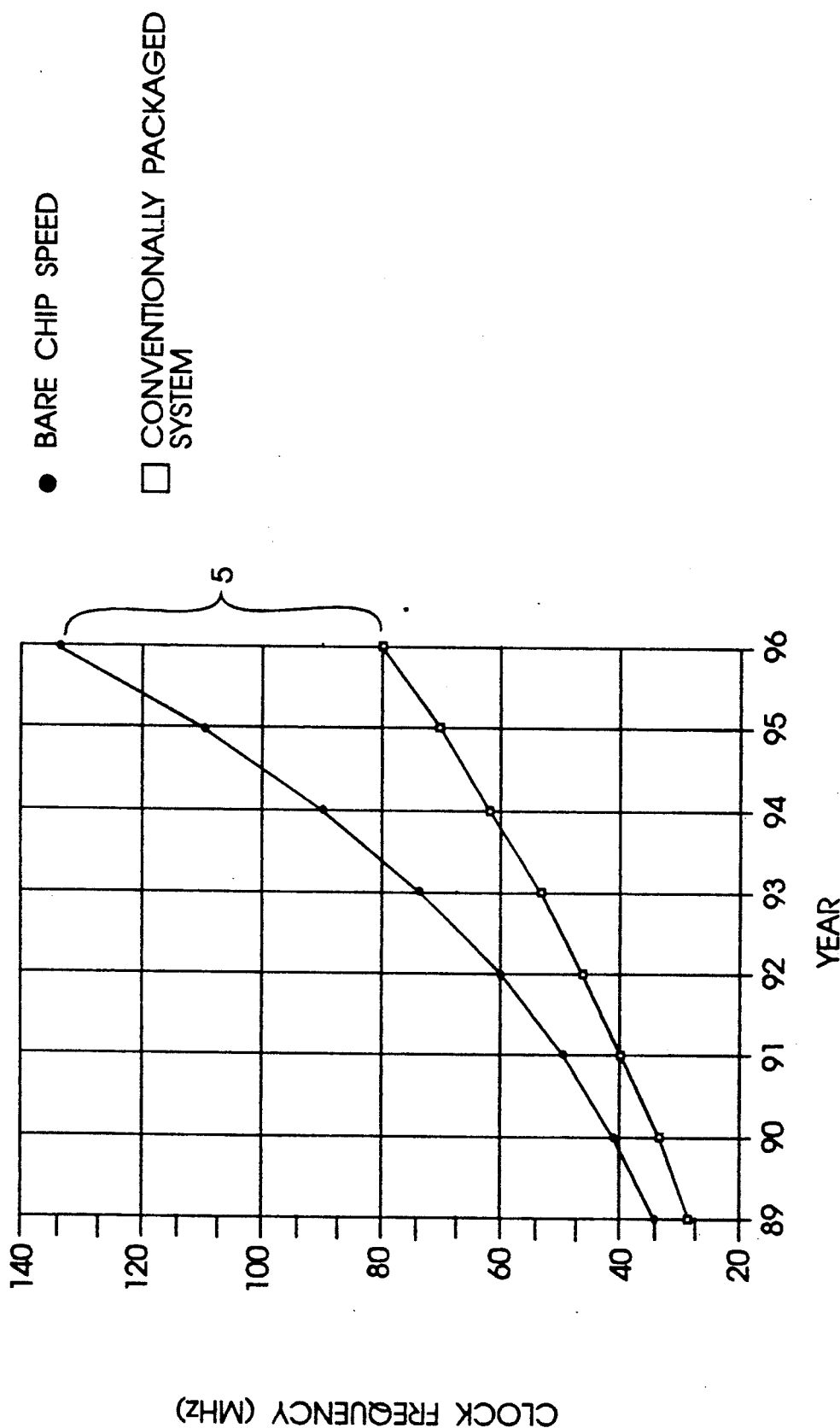
FIG. 1 is a graph comparing IC chip speed to conventional packaging speed.
Figure 2:
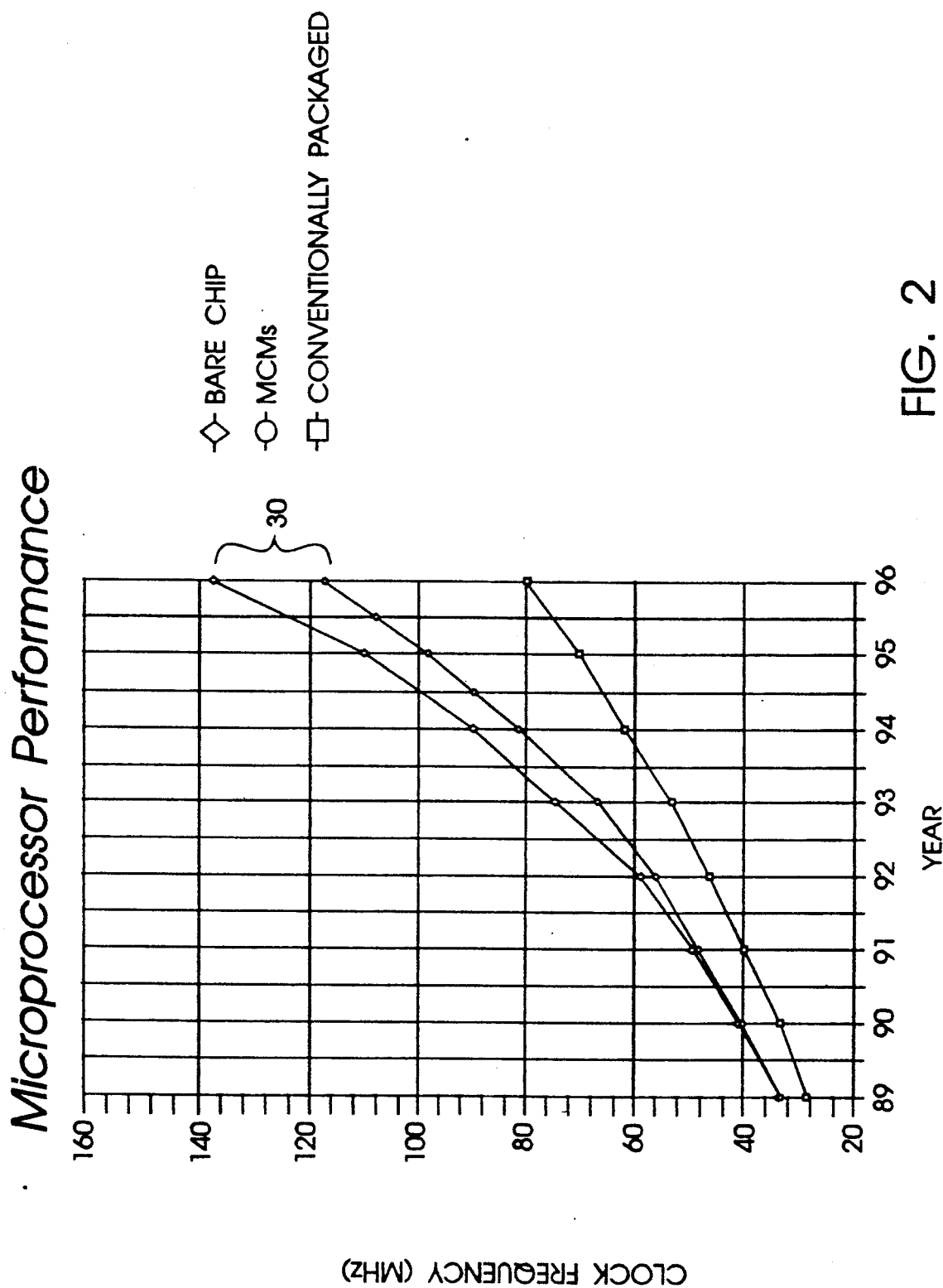
FIG. 2 is a graph comparing IC chip speed to multichip module speed and conventional packaging speed.
Figures 1, 11:
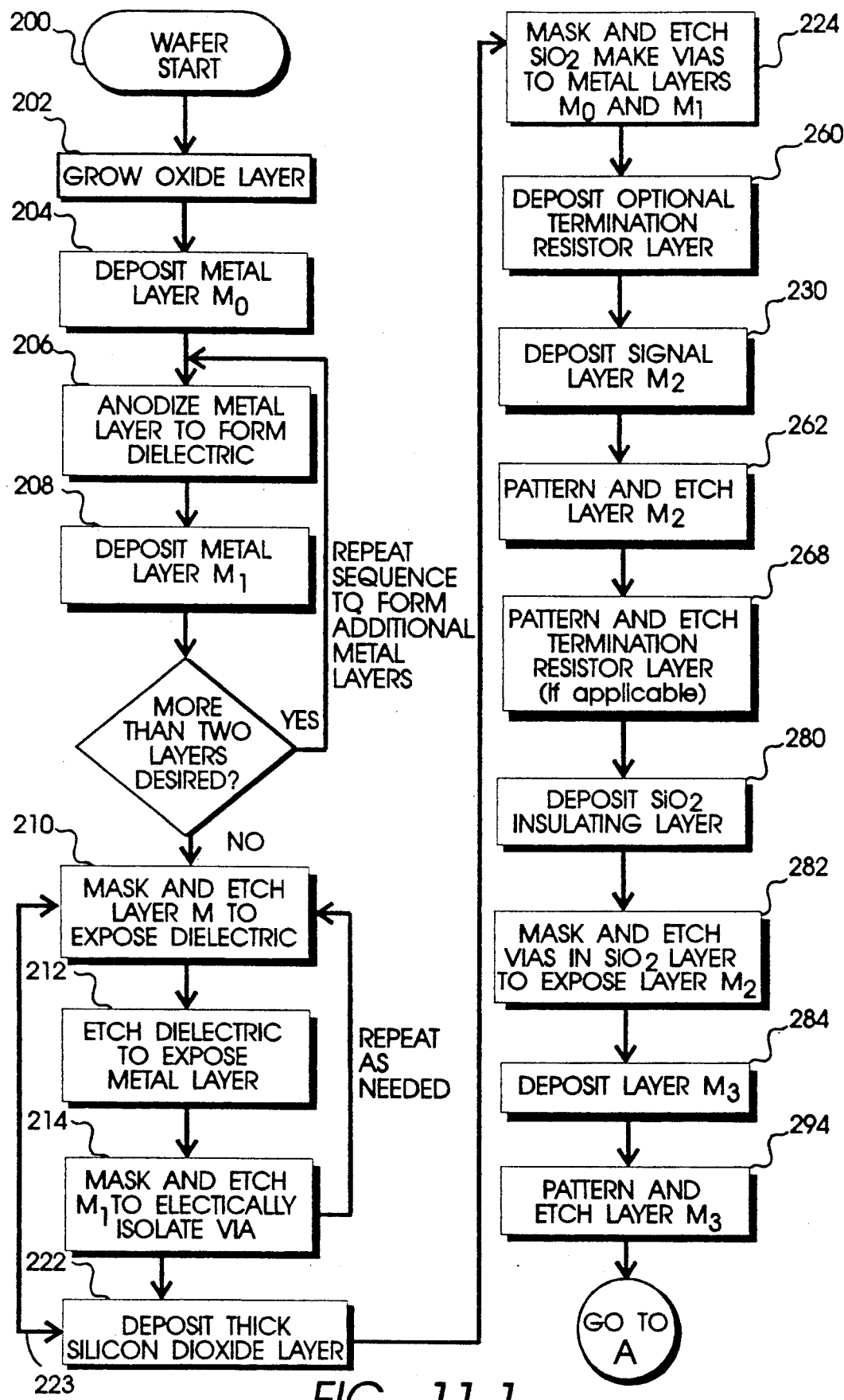
Figures 2, 11:
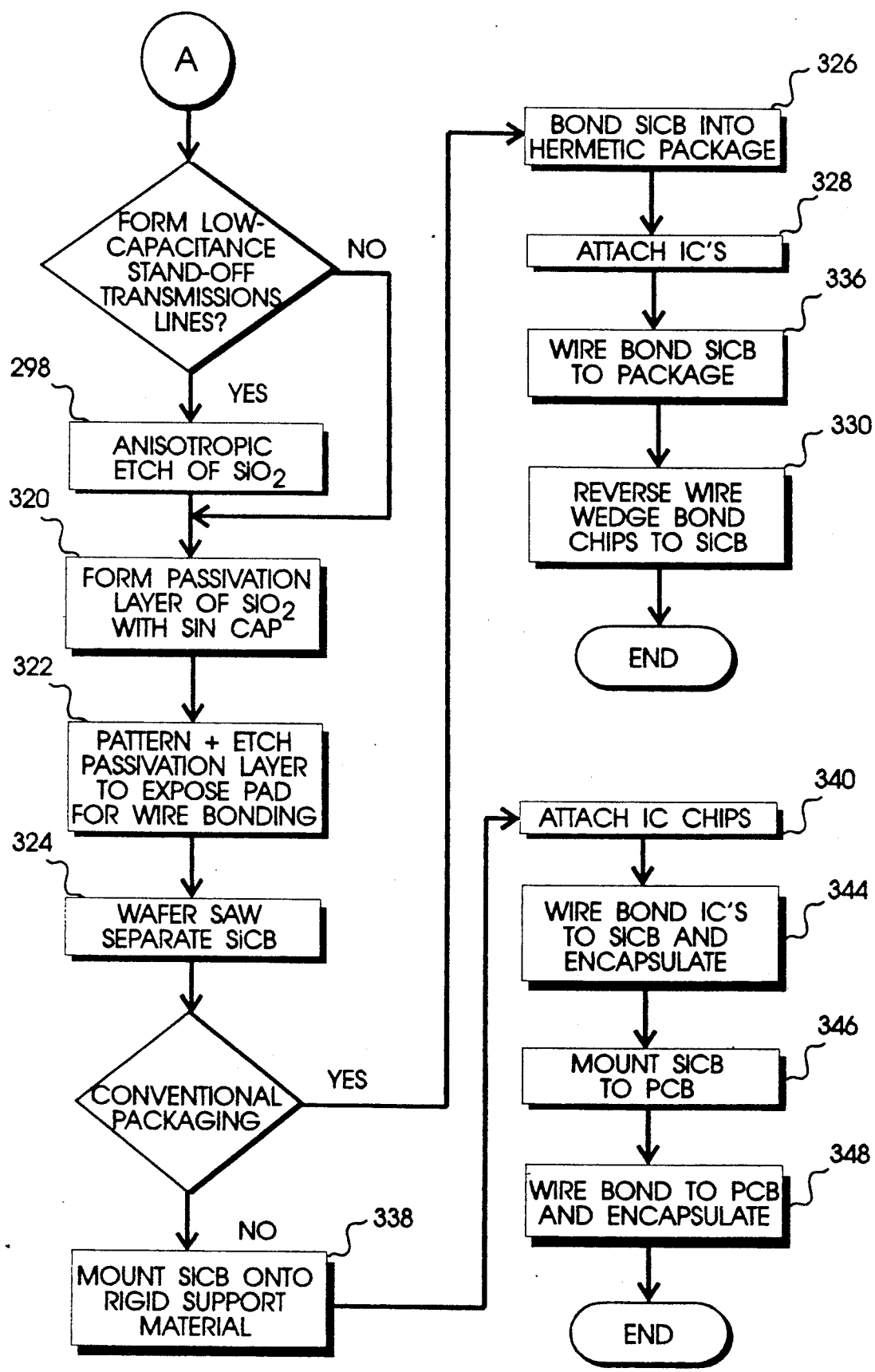

A process for fabricating the multichip module of the present invention is described by reference to the flow chart contained in FIGS. 11-1 through 11-2. In the process description that follows, fabrication of the structures of FIGS. 3 and 6 will be used as an illustrative example. All references to the structure of the completed multichip module may therefore be found in FIGS. 3 and 6 unless otherwise noted. All references, to process steps may be found in FIGS. 11-1 through 11-2.

The process begins at step 200 with an unprocessed standard-size wafer. A standard-size wafer has a typical diameter of 125 mm and thickness of 0.5 mm. Nonstandard size wafers also may be used and various shapes other than a wafer may be used. The unprocessed wafer may be formed from various materials, including: Al$_2$O$_3$, AlN, copper-tungsten alloy, a composite sandwich structure of BeO, quartz, glass or other well known materials. In a preferred embodiment of the invention, the wafer is composed either of silicon or of polycrystalline silicon and forms support base 40 of the multichip module.

After inspection of the wafer, oxide layer 46 is thermally grown in step 202 on the top surface of wafer 40 to a thickness of approximately 0.8 $\mu$m. A metal film, which can be an aluminum film, or other conductor having a top surface of anodizable metal, e.g., a Ta/Cu/Ta sandwich; is deposited over oxide layer 46 in step 204. This metal film, or metal layer $M_0$, eventually forms ground plane 44 seen in FIG. 3. The aluminum film is deposited on top of oxide layer 46 using vacuum deposition techniques well known to those of skill in the art. A preferred embodiment of the invention uses sputtering vacuum deposition. The deposition processes deposit a film of aluminum approximately 1.25 to 2.25 $\mu$m thick over the entire surface of the structure.

After deposition of metal layer $M_0$, a layer of $Al_2O_3$ in step 206. Thus, the anodization process consumes a portion of layer $M_0$, leaving an $M_0$ layer of approximately 1-2 $\mu$m. The resulting $Al_2O_3$ layer serves as dielectric 48 and is formed over the entire surface area of the module structure. If layer $M_0$ comprises a material other than aluminum, the anodization process forms the oxide of the material used.

A second vacuum deposition of a metal film over the entire surface of the structure occurs in step 208. This metal layer, $M_1$, forms power plane 42 and also is composed of aluminum in a preferred embodiment. If layer $M_1$ comprises the final power/ground layer, the metal film is deposited to a thickness of 1-2 $\mu$m.

Although FIG. 3 depicts only a single power and a single ground plane, multiple power and ground planes may be formed to permit connection of IC 90 to multiple voltages. If additional metallization is desired, steps 206 and 208 of the process are repeated. Metal layer $M_1$ should therefore be deposited to a thickness of 1.25 to 2.25 $\mu$m to allow for the consumption of material during the anodization process.

Figure 12:
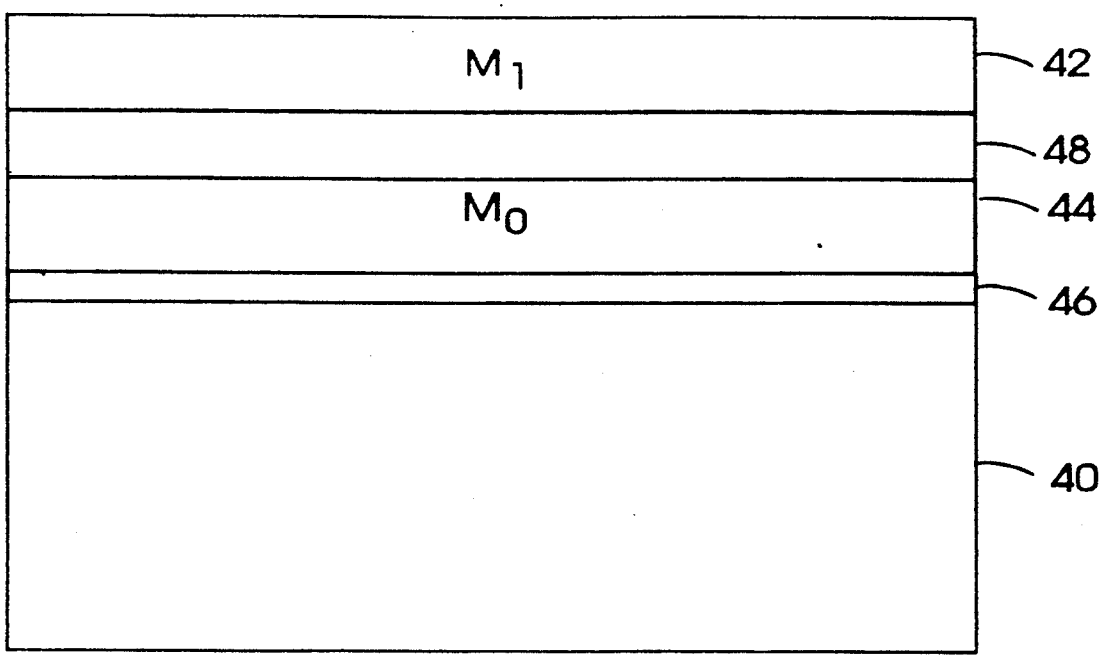
FIG. 12 is a cross-sectional view of a partially completed multichip module according to an embodiment of the present invention.
Figure 13:
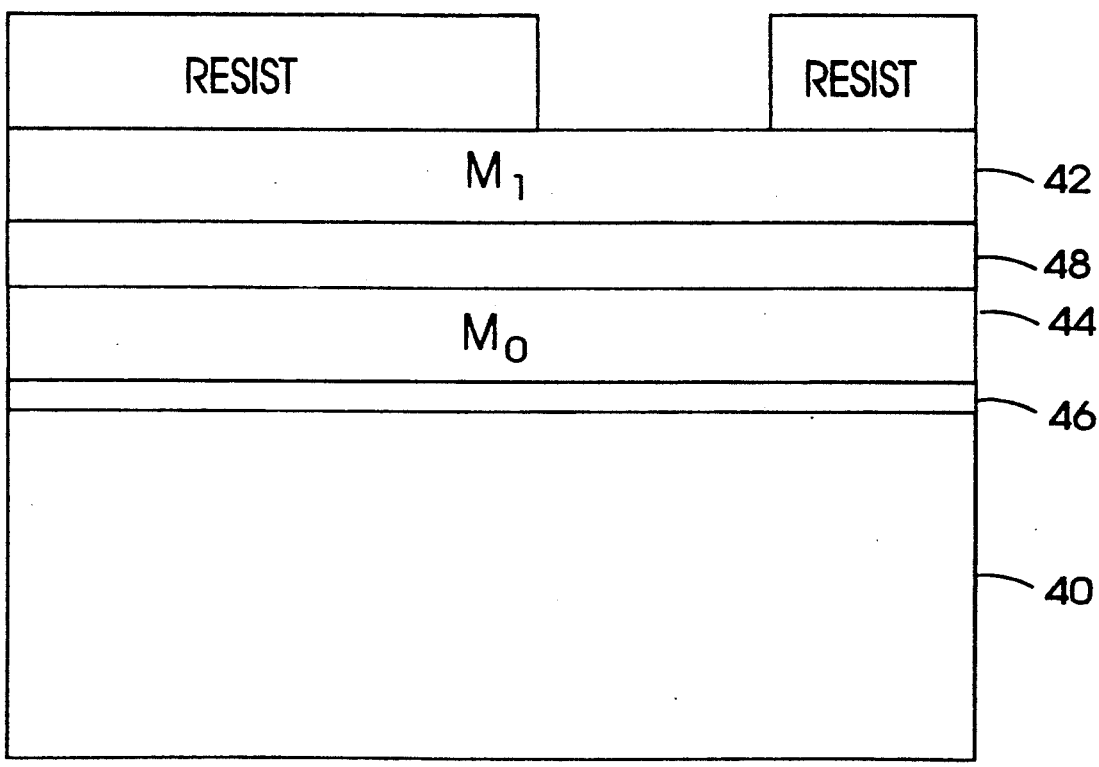
FIG. 13 is a cross-sectional view of a partially completed multichip module that has been masked according to an embodiment of the present invention.
Figure 14:
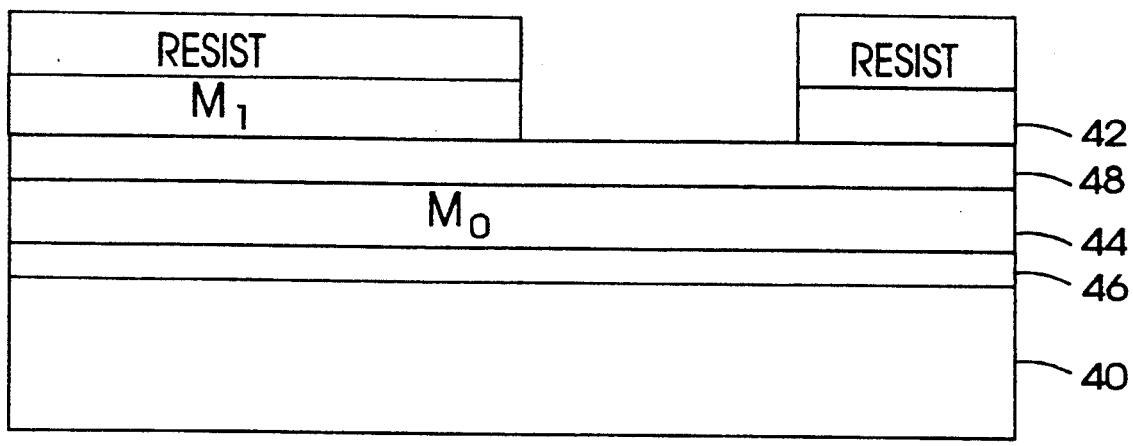
FIG. 14 is a cross-sectional view of a partially completed multichip module that has been partially etched according to an embodiment of the present invention.
Figure 15:
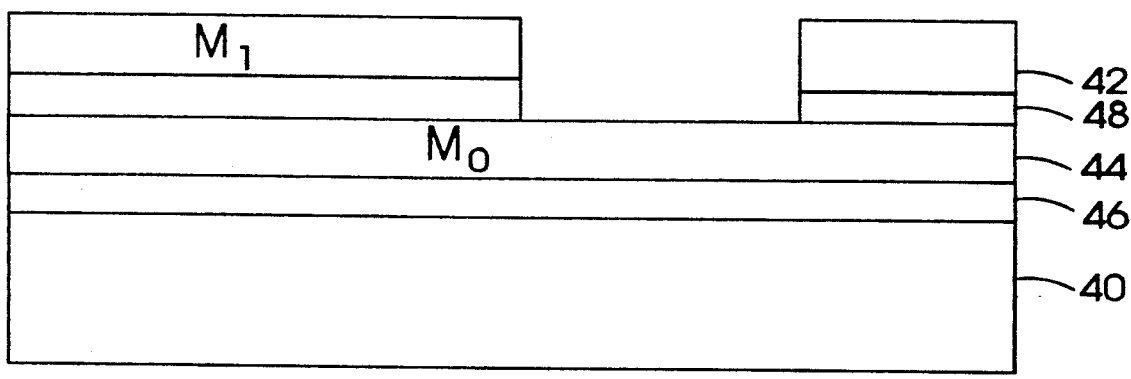
FIG. 15 is cross-sectional view of a partially completed multichip module in which a via has been formed according to an of the present invention.
Figure 16:
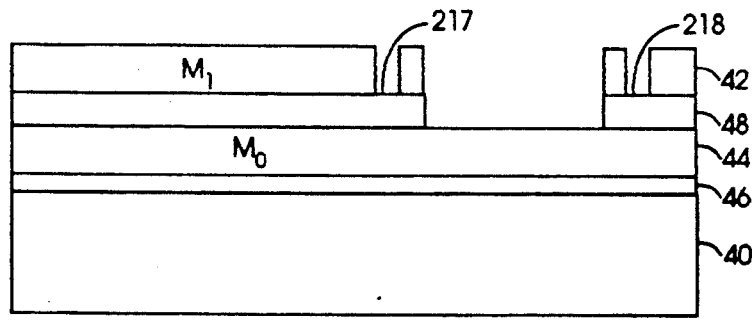
FIG. 16 is a cross-sectional view of a partially completed multichip module showing electrical isolation of a first metal layer from a via used to contact another metal layer.

After step 208 of the process the structure shown in FIG. 12 results. Openings must thus be formed through layers 42 and 48 to permit contact to layer $M_0$, which forms ground plane 44. The openings are patterned in step 210 using photolithography techniques well known in the art to form the structure shown in FIG. 13. A wet chemical etch, etches those areas of metal $M_1$ not covered by resist to expose $Al_2O_3$ layer 48 and form the structure of FIG. 14. The resist may then be removed using conventional methods. Using the remaining metal $M_1$ as a mask, the exposed areas of $Al_2O_3$ are etched with a chemical etch comprising a mixture of $CrO_3$ and $H_3PO_4$ in water at approximately 65°-85° C. A mixture of 2 percent $CrO_3$ and 5 percent $H_3PO_4$ in water may be used. Alternatively, an aqueous solution of primarily ammonium fluoride containing additives commonly known to those skilled in the art. At the completion of step 212 the structure of FIG. 15 having via 62 to plane 44 results. $M_1$ must then be electrically isolated from via 62 used to contact layer $M_0$ by completing step 214. Metal $M_1$ is again masked using conventional photolithography and etched with a wet chemical etch to remove metal $M_1$ in areas 217 and 218 adjacent to the via. Any other desired cuts in $M_1$, e.g., to create isolated power planes, can also be made at this time. See FIG. 16. An annular top surface of $Al_2O_3$ is thus left exposed. Vias to the desired metal layers are formed by repeating steps 210 and 212 (and 214, if applicable).

An alternative process to steps 210, 212, 214 can be used when an $Al_2O_3$ etch is available which does not attack adversely photoresist (for example, a $BCl_3$ plasma or certain wet etches). Here $M_1$ can be processed conventionally like step 210 except that all desired cuts in $M_1$ are done at this step, rather than as part of step 214. The photoresist is then stripped. A new photoresist pattern is then created with vias concentric with but inside the openings in $M_1$ (where ground contacts are desired). The $Al_2O_3$ is then etched and the photoresist is stripped. This process flow is simpler because step 214 is eliminated and yields a more capacitive ground contact, but requires an etchant other than the hot $H_3PO_4/CrO_3/H_2O$ mixture described above (which can attack photoresist).

An additional process than that described above and in steps 210-214, to form contact to conducting layers $M_0$ and $M_1$ also exists.

In this alternative process sequence, layer $M_1$ is patterned and etched in step 210 at those locations where a contact to the underlying metal layer $M_0$ is ultimately desired. Step 212 which etches the dielectric layer and step 214 are not conducted at this time. In this process for forming conducting layer contacts, the process flow proceeds directly to step 222 as indicated by arrow 223 exiting box 210.

After metallization, a thick layer of $SiO_2$ is deposited over the structure in step 222. The layer of $SiO_2$ forms dielectric 70 and is deposited to a thickness of 7-15 $\mu$m using plasma-enhanced chemical vapor deposition. Thicknesses of up to 20 $\mu$m may be deposited, if necessary, to provide the desired low capacitance of the signal layers 76 and 77 relative to the power and ground layers. To achieve these thicknesses, the $SiO_2$ is deposited so as to yield moderate in-plane biaxial compressive stress. Generally, the residual compressive oxide stress on the substrate should be kept to under $1 \times 10^9$ dynes/cm$^2$. One method for depositing the silicon under compression using plasma-enhanced chemical vapor deposition to achieve these stress limits is described in the U.S. patent application to Schoenholtz for *Improved Plasma Enhanced Chemical Vapor Deposition Process* referenced above.

In step 224, silicon dioxide dielectric layer 70 is patterned using photolithography techniques and etched to expose the vias to metal layer $M_0$, and to create via contacts to metal layer $M_1$ where needed. After steps 222 and 224, the multichip module appears as in FIG. 17.

After deposition of the silicon dioxide layer in step 222, if the process flow including arrow 223 is used, the patterning and etching step of 224 comprises opening vias to metal layer M, as desired and also opening vias to expose those portions of the dielectric layer not covered by metal $M_1$. The exposed portion of the dielectric layer can then be etched away by dipping the module into a $H_3PO_4/CrO_3/H_2O$ etchant to open a via for the $M_0$ contact. The process flow incorporating arrow 223 thus reduces a mask step over the other possible processes described herein thereby further reducing module cost.

The remainder of the fabrication process will vary depending upon whether a resistor layer is desired for metal signal layers 76 and 77. If the signal layers are composed of aluminum, termination resistors can normally be omitted from the module signal layer structure owing to the relatively high resistance of aluminum. In this case, the process proceeds to step 230 in which the aluminum is sputter deposited and patterned to form metal signal layer 76, or $M_2$, which typically has a thickness of 2–3 µm.

Figure 18:
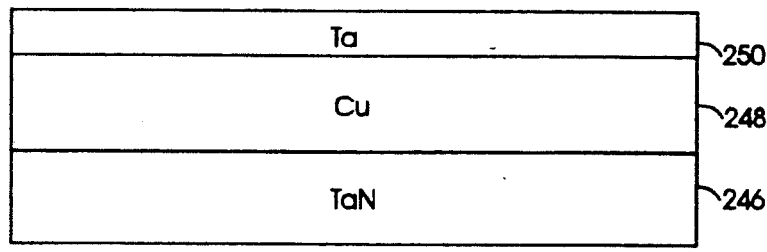
FIG. 18 a cross-sectional view of a sandwich structure used to form a metal signal layer according to an embodiment of the present invention.

However, when the signal layer is composed of copper, for example, termination resistors often form part of the signal layer structure. Metal signal layer 76 may therefore be constructed as a three-layer metal sandwich as shown in FIG. 18. The sandwich structure comprises a tantalum nitride layer 246, a copper layer 248 and a tantalum upper layer 250. Optionally, tantalum nitride may be used to construct upper layer 250. Tantalum nitride layer 246 ultimately forms a termination resistor at the completion of the fabrication process but also serves as an adhesive layer. Copper layer 248 carries the signal and tantalum layer 250 serves as an optional adhesion layer between the upper surface of copper layer 248 and overlying $SiO_2$.

Figure 17:
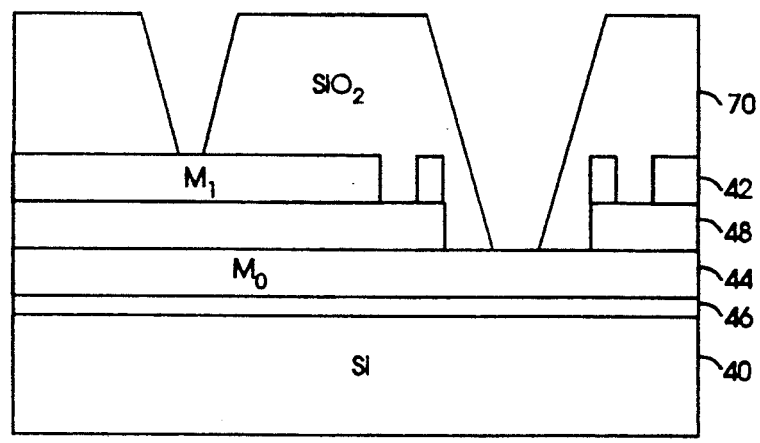
FIG. 17 is a cross-sectional view of a partially completed module after deposition of a silicon dioxide dielectric layer according to an embodiment of the present invention.

The sandwich signal layer structure of FIG. 18 is obtained from FIG. 17 by depositing a tantalum nitride layer 246 approximately 0.2 µm thick over dielectric 70. See step 260. Over this layer of tantalum nitride, in step 230, is sputter deposited copper layer 248 to a thickness of 3–4 µm. Layer 250 of tantalum may then deposited to a thickness of ≦0.05 µm over copper layer 248 if desired to complete formation of the metal signal layer in step 230. The composite metal structure thus totals 3–4 µm.

Figure 19:
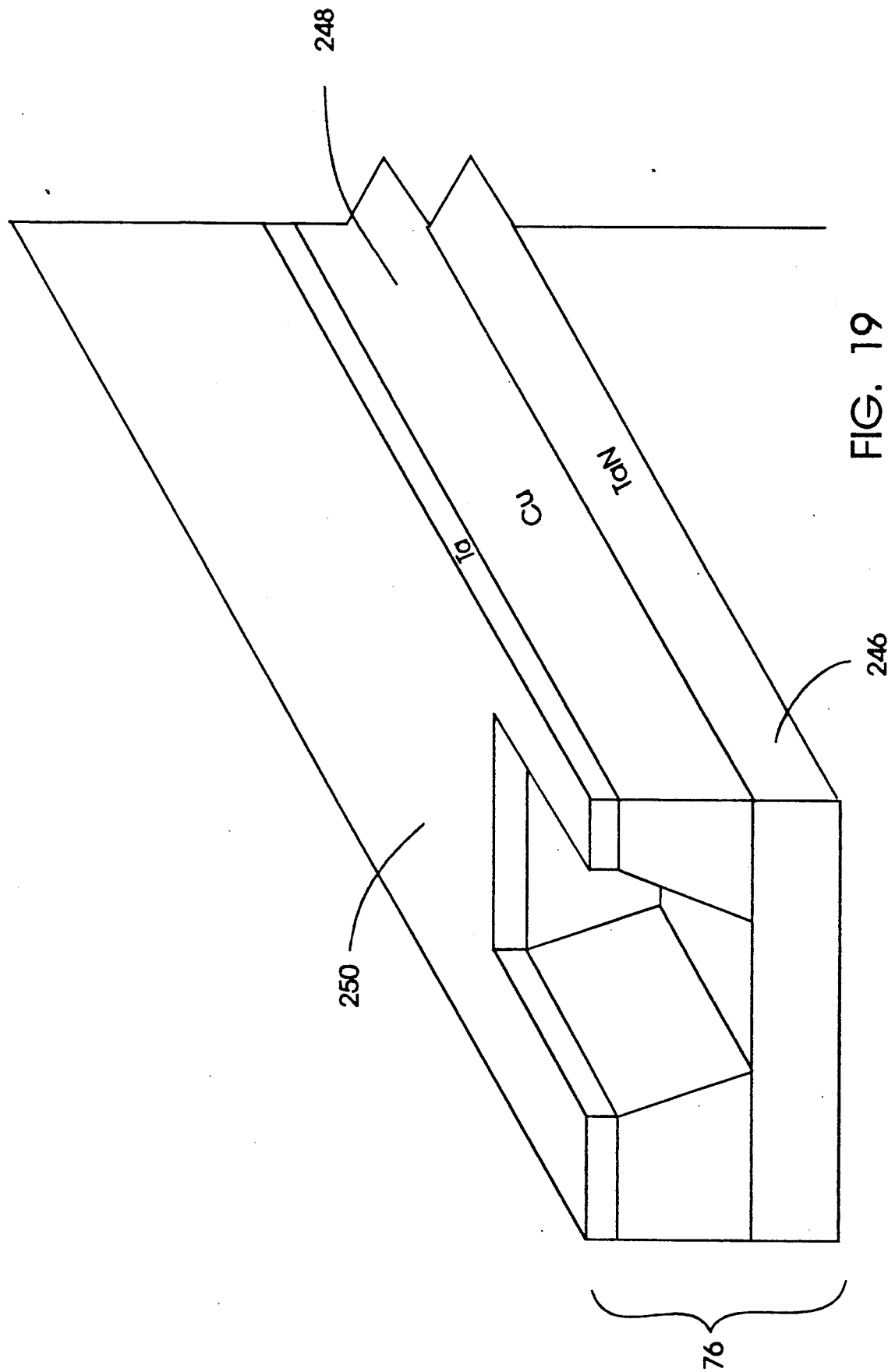
FIG. 19 is an isometric view of a composite metal signal layer having a signal via and termination resistor via according to an embodiment of the present invention.

In step 262, the signal layer deposited in step 230 is patterned and etched to permit contact to underlying layers. If the metal signal layer is constructed with the termination resistor structure, layer 250 of tantalum must be etched away at those locations where a contact to signal carrying copper layer 248 and to termination resistor layer 246 is desired. A dry etch removes layer 250 in step 268. Copper layer 248 is also etched in step 268 to expose resistor layer 246. FIG. 19 shows an isometric view of a composite metal signal layer including termination resistor contact 272 upon completion of step 268.

Figure 20:
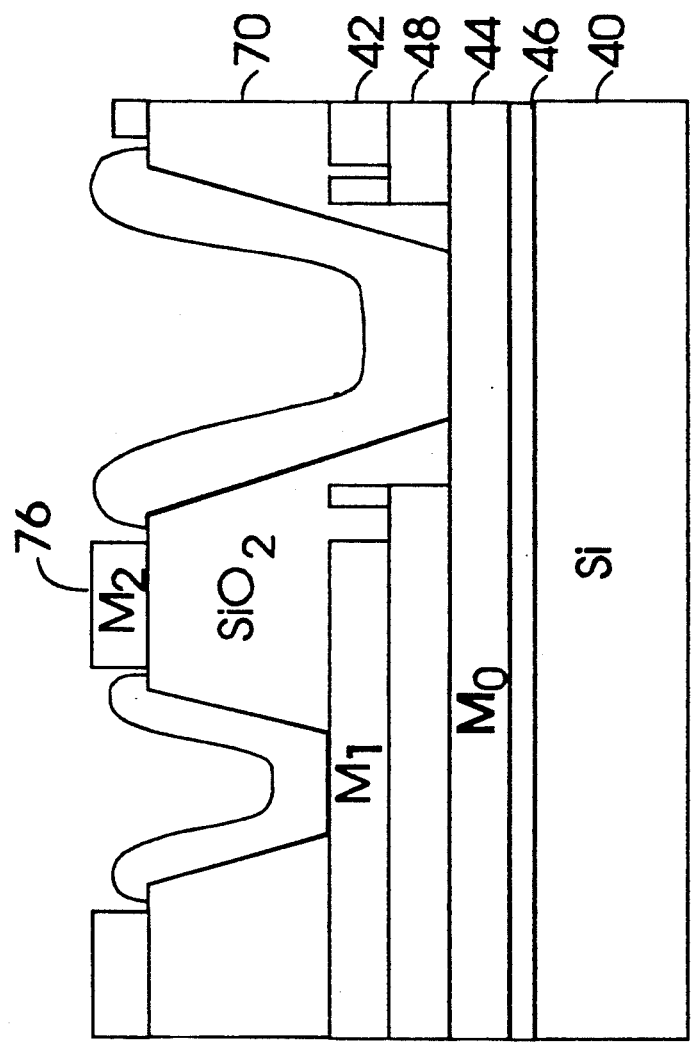
FIG. 20 is a cross-sectional view of a partially completed multichip module after metallization of a first signal layer according to an embodiment of the present invention.

FIG. 20 depicts the partially completed multichip module structure after metallization of signal layer 76 with either aluminum or copper as described above. After metallization is complete, an insulating layer 78 of $SiO_2$ is deposited over metal layer $M_2$ in step 280 to form layer 78. Layer 78 is deposited using plasma-enhanced chemical vapor deposition. In step 282, layer 78 of $SiO_2$ is then patterned and etched to open vias to underlying metal layer $M_2$ where desired. The silicon dioxide remaining over layer $M_2$ has a typical thickness of 3 µm.

Over insulating layer 78, a second metallization occurs to form layer $M_3$, which may be used to form metal signal layer 77 of FIG. 3. If the metal film forming the layer is composed of aluminum, the layer may be formed in a single deposition step 284. If the metal film is composed of another metal such as copper, then a composite metal sandwich structure must be built to form signal layer 77. The process for fabricating this structure occurs in steps 285–289 and is somewhat analogous to the process of steps 260–264 except that termination resistors are not formed. Metal signal layer 77 has a thickness approximating 3–4 µm when completed. Additional metal signal layers other than the two layers depicted in FIG. 3 are formed by repeating steps 260 to 294.

Figure 21A:
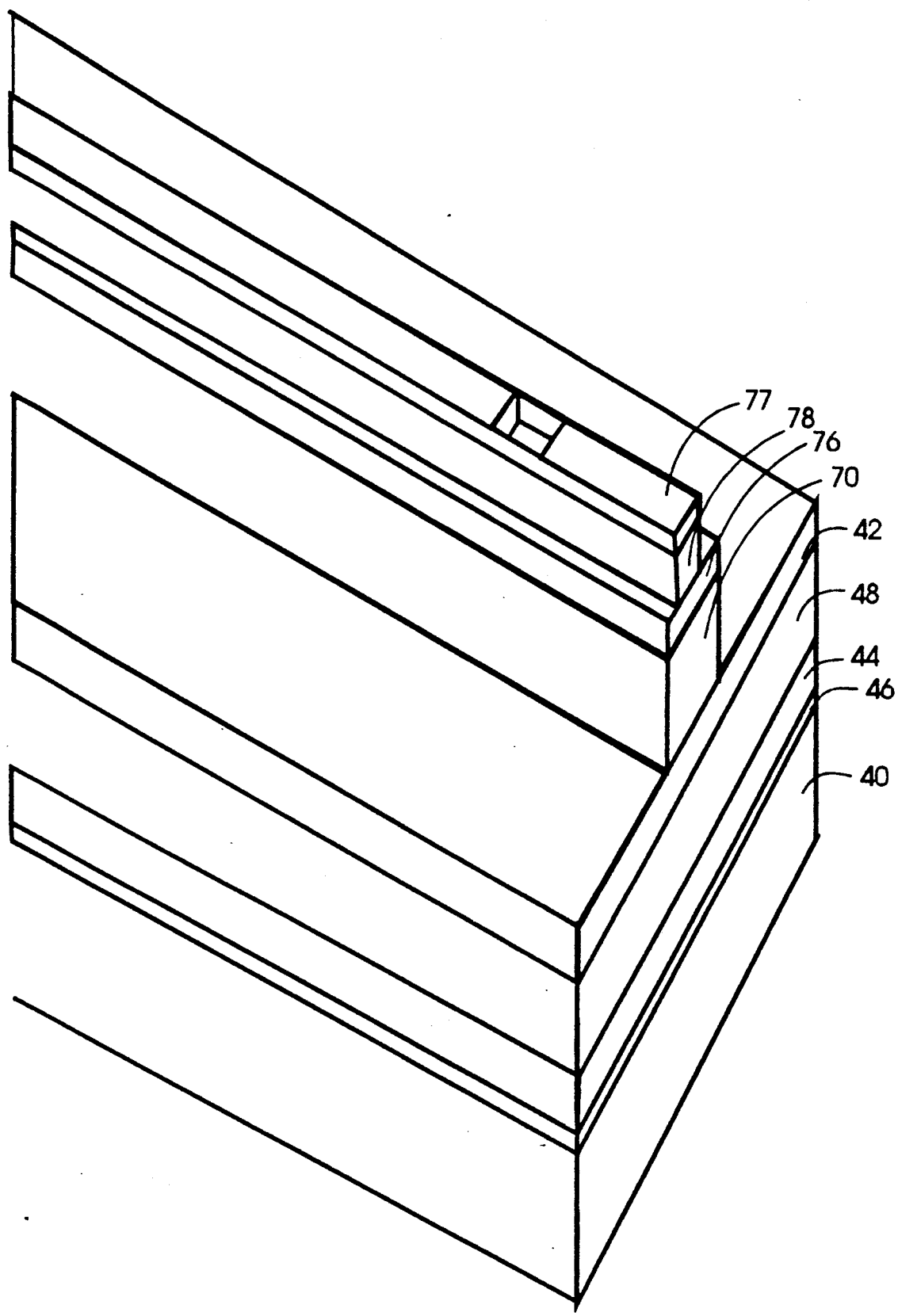
FIG. 21A is an isometric view of a multichip module according to an embodiment of the present invention.
Figure 21B:
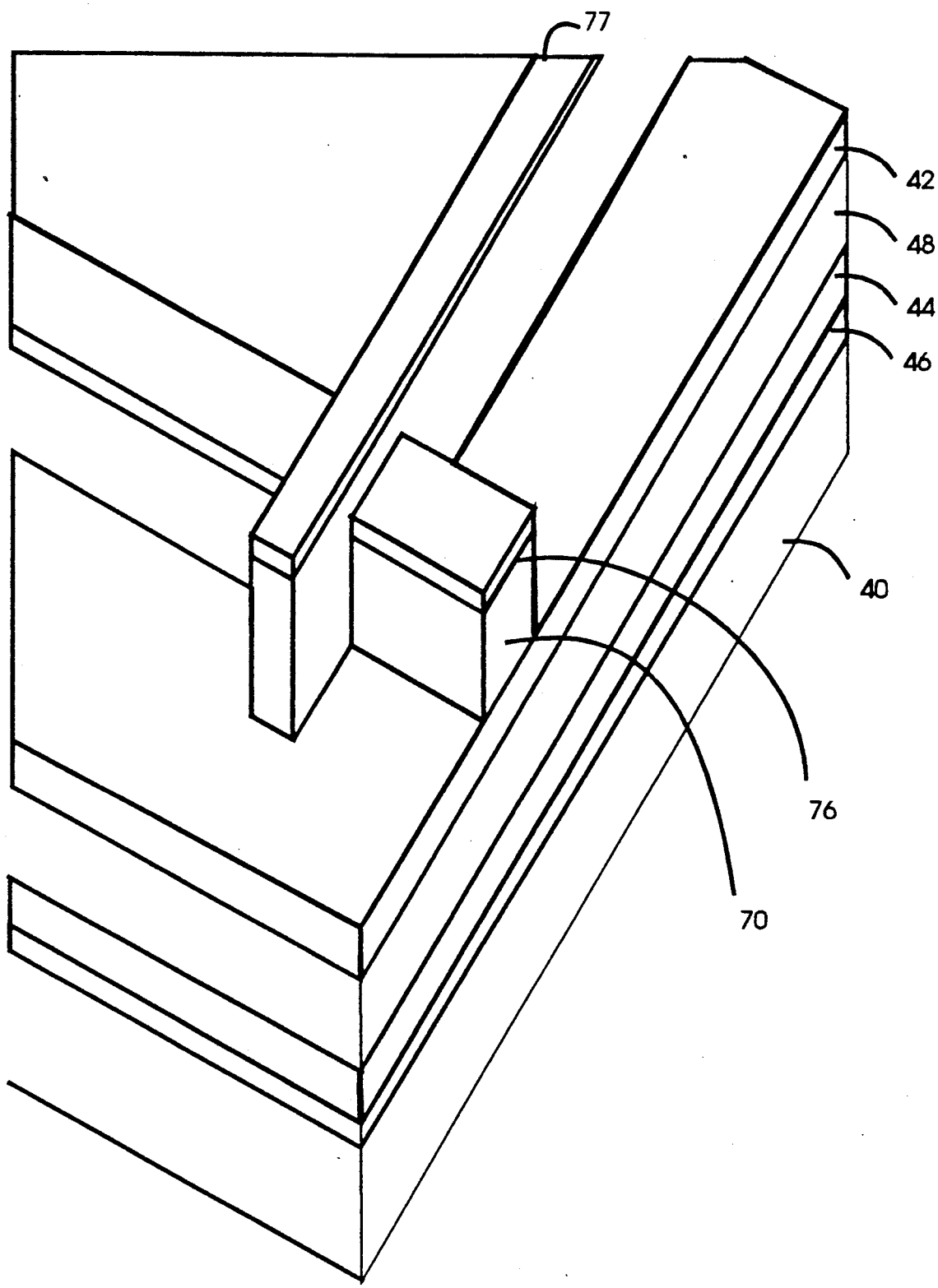
FIG. 21B is an isometric view of a multichip module according to an alternate embodiment of the present invention.

If layer $M_3$ forms an independent signal layer from $M_2$, then layer $M_3$ will often be oriented perpendicular to layer $M_2$ as shown in FIG. 21B. If the wire strap method of FIG. 5 is used, then layer $M_3$ runs over layer $M_2$ as shown in FIG. 21A. Note that layer $M_3$ has slightly different width than layer $M_2$ to avoid coincident edges. Whether or not a metal strap structure is employed, metal $M_3$ is then patterned and etched in step 294 to form the desired interconnect pattern. When $M_3$ is formed of a composite metal structure, sequential etches are performed in step 294 to remove the metal layers.

If the reduced capacitance structure pictured in FIG. 6 is required, then step 298 must be performed. In this step, the metal layers 76–77 are used as a mask for an anisotropic etch of the underlying silicon dioxide dielectric layers 78 and 70. FIG. 21A depicts an isometric view of the multichip module with wire strapping upon completion of these steps and FIG. 21B depicts the structure with two distinct signal layers oriented at a ninety degree angle to each other.

A passivation layer 80 is deposited in step 320. The passivation layer comprises silicon dioxide layer 84 over which a silicon nitride cap 86 is placed. The silicon dioxide and silicon nitride are deposited using plasma-enhanced chemical vapor deposition. Passivation layer 80 is approximately 2–6 µm thick, and serves to protect the module from abrasions and contaminants. The passivation layer 80 is then patterned and etched in step 322 to expose pads for wire bonding of IC 90 to the module. Formation and etch of the passivation layer completes wafer fabrication.

Assembly of the wafer and ICs into multichip modules begins by separating the completed wafer into individual modules, or silicon circuit boards (SiCB), using a wafer saw. See step 324. If the module is to be conventionally mounted, step 326 of the fabrication/assembly process places the module in a hermetic package that contains leads for later mounting of the module/chip assembly to a circuit board. In step 328, ICs 90 are bonded to the SiCB. The ICs 90 are electrically connected to the SiCB using reverse wire wedge bonding as described in FIG. 8. See step 330. The reverse wire wedge bond consumes less surface area on the module and permits greater chip densities. Wire bonds are also made between the package and the SiCB. See step 336. The completed conventional package is as depicted in FIG. 9.

Figure 10:
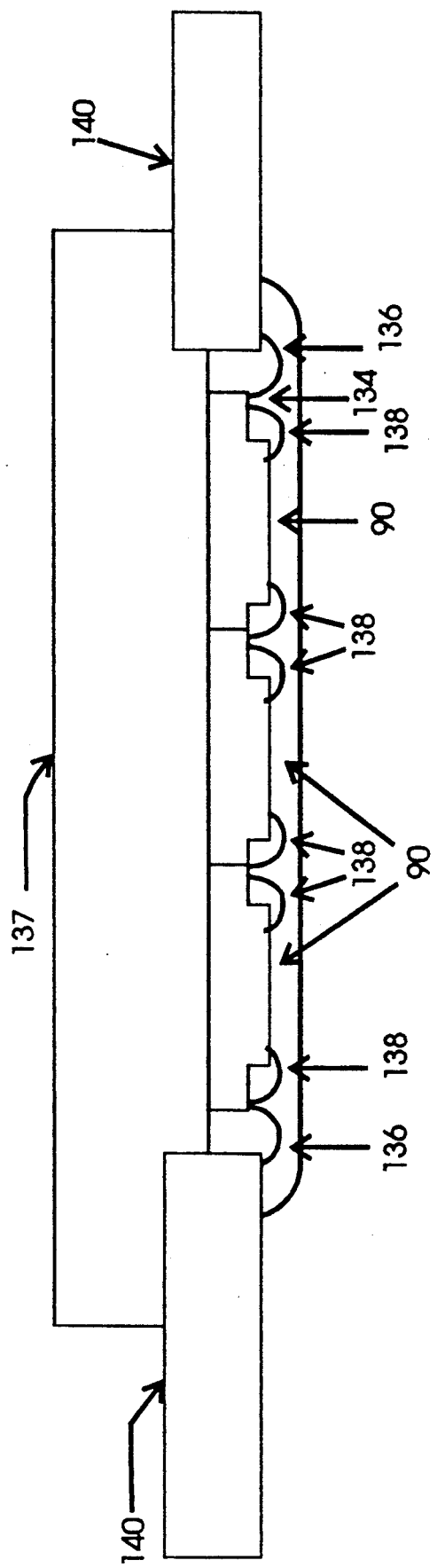
FIG. 10 is a view of a substrate-on-board mounting technique according to an embodiment of the present invention.

The IC 90/module assembly is now ready for connection to the printed circuit board. If a substrate-on-board mounting technique previously illustrated in FIG. 10 is used, the SiCB is first mounted to a rigid backing such as copper tungsten in step 338 to form a support structure. The backing should preferably have a thermal expansion closely matched to the SiCB and a good thermal conductor. Examples of possible backing materials include molybdenum and a copper/Invar sandwich in addition to the copper tungsten material mentioned above. Chips are then attached in step 340. The chips are wire bonded to the SiCB and then the chips, or interior surface portions of the SiCB encapsulated, e.g. with epoxy. The entire assembly is then mounted to the printed circuit board, wire bonded and encapsulated. Alternatively, the electrical connection of the SiCB to the circuit board may be accomplished using other procedures known to those of skill in the art, such as tape for example. See steps 334–348 of FIG. 11.

An embodiment of the present invention has now been described. Variations and modifications will be readily apparent to those of skill in the art. For these reasons, the invention should be construed in light of the claims.

What is claimed is:

1. A method for mechanically and electrically connecting an integrated circuit to a silicon circuit board comprising the steps of:

dispensing an electrically nonconductive and thermally conductive adhesive on a surface of said silicon circuit board, wherein said adhesive is deposited to have a void to expose an underlying bond pad of said silicon circuit board; and attaching an electrically conductive material to said bond pad and a back side of said integrated circuit.

2. The method for mechanically and electrically connecting of claim 1 wherein said step of dispensing an electrically nonconductive and thermally conductive adhesive comprises the step of:

dispensing an epoxy material having boron nitride dispersed throughout the epoxy material.

3. The method for mechanically and electrically connecting of claim 1 wherein said step of dispensing an electrically nonconductive and thermally conductive adhesive comprises the step of:

dispensing an epoxy material having diamond dust dispersed throughout the epoxy material.

4. A method for mechanically and electrically connecting an integrated circuit to a silicon circuit board comprising the steps of:

dispensing an electrically conductive and thermally conductive adhesive on a surface of said silicon circuit board, wherein said adhesive is deposited to have a void to expose an underlying bond pad of said silicon circuit board;

dispensing an electrically conductive adhesive over said electrically nonconductive and thermally conductive adhesive and within said void; and placing the integrated circuit on said electrically conductive adhesive.

5. The method for mechanically and electrically connecting of claim 4 wherein said step of dispensing an electrically nonconductive and thermally conductive adhesive comprises the step of:

dispensing an epoxy material having boron nitride dispersed throughout the epoxy material.

6. The method for mechanically and electrically connecting of claim 4 wherein said step of dispensing an electrically nonconductive and thermally conductive adhesive comprises the step of:

dispensing an epoxy material having diamond dust dispersed throughout the epoxy material.

7. The method for assembling a plurality of integrated circuits to form a multichip module and connecting said multichip module to a printed circuit board comprising the steps of:

mounting a rigid support material on a bottom surface of a silicon circuit board;

mechanically attaching said plurality of integrated circuits to a top surface of said silicon circuit board to form a multichip module;

electrically connecting said plurality of integrated circuits to said silicon circuit board;

encapsulating at least an interior region of a top surface portion of said multichip module;

mounting said multichip module on said printed circuit board wherein said top surface of said multichip module faces said printed circuit board; and electrically connecting said printed circuit board to a bond pad of said multichip module.

8. The method for assembling of claim 7 further comprising the step of:

encapsulating a resulting printed circuit board and multichip module structure.

9. The method of assembling of claim 7 wherein said step of electrically connecting said plurality of integrated circuits to said silicon circuit board comprises reverse wedge wire bonding.

10. The method of assembling of claim 7 wherein said step of mechanically attaching said plurality of integrated circuits to said silicon circuit board comprises the steps of:

dispensing an epoxy material having a high atomic weight material dispersed throughout the epoxy material.

11. The method of assembling of claim 7 wherein said step of mechanically attaching said plurality of integrated circuits to said silicon circuit board comprises the step of:

dispensing an epoxy material having diamond dust dispersed throughout the epoxy material.

12. The method of assembling of claim 7 wherein said step of mechanically attaching said plurality of integrated circuits to said silicon circuit board comprises the step of:

dispensing an epoxy material having boron nitride dispersed throughout the epoxy material.

13. The method of assembling of claim 7 wherein said step of mechanically attaching said plurality of integrated circuits to said silicon circuit board comprises the step of:

dispensing an adhesive material wherein said adhesive material is electrically nonconductive and thermally conductive.

14. The method of assembling of claim 7 wherein said step of electrically connecting said printed circuit board to a bond pad comprises wire bonding.

15. The method of assembling of claim 7 wherein said steps of mechanically attaching and electrically connecting said plurality of integrated circuits to said silicon circuit board comprise the steps of:

dispensing an electrically nonconductive and thermally conductive adhesive on a surface of said silicon circuit board, wherein said adhesive is deposited to have a void to expose an underlying bond pad of said silicon circuit board; and dispensing an electrically conductive adhesive over said electrically nonconductive, thermally conductive adhesive and within said void.

16. The method of assembling of claim 7, further comprising the step of dispensing an electrically nonconductive and thermally conductive adhesive on a surface of said silicon circuit board wherein said adhesive is deposited to have a void to expose an underlying bond pad of said silicon circuit board; and attaching an electrically conductive material to a back side of said integrated circuit and to said bond pad.

* * * * *

UNITED STATES PATENT AND TRADEMARK OFFICE
CERTIFICATE OF CORRECTION

PATENT NO. : 5,214,844
DATED : June 1, 1993
INVENTOR(S) : Bruce M. McWilliams, et al.

It is certified that error appears in the above-indentified patent and that said Letters Patent is hereby corrected as shown below:

Col. 3, line 42, kindly insert --embodiment-- after the word "an".

Col. 7, line 67, Kindly delete "a".

Col. 9, line 20 kindly insert --approximately 0.2 μm thick is formed by anodizing metal layer $M_0$-- after "$Al_2O_3$".

On the title page, item [56] References Cited under Foreign Patent Documents Cited

Japanese Patent "2-1504415" (6/1990) is listed on IDS as 2-150415.

Other Publications

Please insert --Tuckerman, D., "Ultrahigh Thermal Conductance Microstructures for Cooling Integrated Circuits", <u>32nd Electronic Components Conf.</u>, May, 1982.

Signed and Sealed this

Twenty-sixth Day of April, 1994

Attest:

BRUCE LEHMAN

Attesting Officer　　Commissioner of Patents and Trademarks